(12) United States Patent
Seo

(10) Patent No.: US 6,905,784 B2
(45) Date of Patent: Jun. 14, 2005

(54) LIGHT EMITTING DEVICE

(75) Inventor: Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 09/934,002

(22) Filed: Aug. 21, 2001

(65) Prior Publication Data

US 2002/0028349 A1 Mar. 7, 2002

(30) Foreign Application Priority Data

Aug. 22, 2000 (JP) ........................................ 2000-251683

(51) Int. Cl.[7] ............................................. H05B 33/14
(52) U.S. Cl. ....................... 428/690; 428/917; 313/502; 313/504; 313/505; 313/506; 257/40; 257/100
(58) Field of Search .................. 428/690, 917; 313/502, 504, 505, 506; 257/40, 103, 100

(56) References Cited

U.S. PATENT DOCUMENTS

| | | | |
|---|---|---|---|
| 4,974,942 A | 12/1990 | Gross et al. | 350/347 |
| 5,216,331 A | 6/1993 | Hosokawa et al. | 315/169.3 |
| 5,294,810 A | 3/1994 | Egusa et al. | 257/40 |
| 5,558,904 A * | 9/1996 | Hsieh et al. | 427/66 |
| 5,756,224 A | 5/1998 | Borner et al. | 428/690 |
| 6,013,384 A | 1/2000 | Kido et al. | |
| 6,160,272 A | 12/2000 | Arai et al. | 257/72 |
| 6,303,238 B1 | 10/2001 | Thompson et al. | 428/690 |
| 6,310,360 B1 | 10/2001 | Forrest et al. | 257/40 |
| 6,414,104 B1 * | 7/2002 | Pei | 528/86 |
| 6,670,645 B2 * | 12/2003 | Grushin et al. | 257/98 |
| 6,677,621 B2 | 1/2004 | Yamazaki et al. | 257/103 |

FOREIGN PATENT DOCUMENTS

| | | |
|---|---|---|
| EP | 0 390 551 B1 | 7/1996 |
| JP | 02-261889 | 10/1990 |
| JP | 03-115486 | 5/1991 |
| JP | 03-230583 | 10/1991 |
| JP | 03-230584 | 10/1991 |
| JP | 06-093258 * | 4/1994 |
| JP | 10012377 A | 1/1998 |
| JP | 10-050480 * | 2/1998 |
| JP | 10-148853 | 6/1998 |
| JP | 10153967 A | 6/1998 |
| JP | 10270171 A | 10/1998 |
| JP | 11-338786 | 12/1999 |
| JP | 2000-150146 * | 5/2000 |

OTHER PUBLICATIONS

D. F. Obrien, M.A., M.E. Thompson, and S. R. Forrest, "Improved Energy Transfer In Electrophosphorescent Devices," Applied Physics Letters, vol. 74, No. 3, pp. 442–444, Jan. 18, 1999.

T. Tsutsui, et al., "High Quantum Efficiency in Organic Light–Emitting Devices With Iridium–Complex As A Triplet Emissive Center," Japanese Journal of Applied Physics, vol. 38, No. 12B, pp. 1502–1504, Dec. 15, 1999.

(Continued)

*Primary Examiner*—Dawn Garrett
(74) *Attorney, Agent, or Firm*—Cook, Alex, McFarron, Manzo, Cummings & Mehler, Ltd.

(57) ABSTRACT

An organic EL film is provided, which can convert triplet excitation energy into emission light using a polymer material. Also, an organic EL element is provided, which has high light-emitting efficiency and higher mechanical and thermal reliability than that in the conventional organic EL element by using the organic EL film. The present invention is characterized in that a polymer material with a heavy atom introduced on a chain or a polymer material doped with molecules containing a heavy atom is used for the organic EL element to introduce the heavy atom effect. In both the materials, the types of heavy atoms include a halogen element (particularly bromine or iodine), a metallic element, and the like. A rare gas element can also be used.

21 Claims, 14 Drawing Sheets

OTHER PUBLICATIONS

English Translation of Abstract—Japanese Patent JP10012377, Jan. 16, 1998.

English Tranlsation of Abstract—Japanese Patent JP10153967, Jun. 9, 1998.

English Translation of Abstract—Japanese Patent JP10270171, Oct. 9, 1998.

Tsutsui T., "The Operation Mechanism And The Light Emission Efficiency of The Organic EL Element," $3^{rd}$ Lecture text, Organic Molecular Electronics and Bioelectronics Division, The Japan Society of Applied Physics, 193, pp. 31–37.

Tsutsui T., "The Operation Mechanism And The Light Emission Efficiency of The Organic EL Element," $3^{rd}$ Lecture text, Organic Molecular Electronics And Bioelectronics Division, The Japan Society of Applied Physics, 1993, pp. 31–37, English Full Translation.

U.S. Appl. No. 60/224,273.*

U.S. Appl. No. 60/215,362.*

Tsutsui, T. et al, "Electroluminescence in Organic Thin Films," Photochemical Processes in Organized Molecular Systems, Elsevier Science pub., pp. 437–450, (1991).

Baldo, M.A. et al, "Highly Efficient Phosphorescent Emission from Organic Electroluminescent Devices," Nature, vol. 395, pp. 151–154, Sep. 10, (1998).

Baldo, M.A. et al, "Very High–Efficiency Green Organic Light–Emitting Devices Based on Electrophosphorescence," Applied Physics Letters, vol. 75, No. 1, pp. 4–6, Jul. 5, (1999).

Inukai, K. et al, "Late–News Paper: 4.0–in. TFT–OLED Displays and a Novel Digital Driving Method," Society for Information Display International Symposium, Digest of Technical Papers, vol. XXXI, SID 00 Digest, pp. 924–927, (2000).

Mizukami, M. et al, "36.1: 6–Bit Digital VGA OLED," Society for Information Display International Symposium, Digest of Technical Papers, vol. XXXI, SID 00 Digest, pp. 912–915 (2000).

Nishi, T. et al, "High Efficiency TFT–OLED Display with Iridium–Complex as Triplet Emissive Center," Proceedings of the $10^{th}$ International Workshop on Inorganic and Organic Electroluminescence (EL '00), Dec. 4–7, 2000, Hamamatsu, Japan, pp. 353–356, (2000).

* cited by examiner

LIGHT EMITTING DEVICE

BACKGROUND OF THE INVENTION

1. Field of the Invention

The present invention generally relates to a light emitting device including an element (hereinafter referred to as an "organic EL element") in which a structure is provided over a substrate and has a thin film layer (hereinafter referred to as an "organic EL layer") that is made of an organic compound from which electro-luminescence (hereinafter referred to as "EL") can be obtained and that is interposed between an anode and a cathode. More particularly, the present invention relates to a light emitting device in which an organic polymer (hereinafter referred to simply as a "polymer" although polymers with a polymerization degree of about 2 to 20 are called oligomers and polymers with a higher polymerization degree than that of the oligomers generally are called polymers) is contained in an organic EL layer and energy generated when a triplet excited state returns to a normal state (hereinafter referred to as "triplet excitation energy") can be converted into emission light. In this specification, the light emitting device indicates an image display device or a light emitting device in which the organic EL element is used as a light emitting element. In addition, examples of the light emitting device also include a module with a tape automated bonding (TAB) tape or a tape carrier package (TCP) attached to an organic EL element, a module with a printed circuit board provided at the end of a TAB tape or a TCP, and a module with an integrated circuit (IC) directly mounted on an organic EL element by a chip on glass (COG) method.

2. Description of the Related Art

An organic EL element is an element that emits light by application of an electric field. In view of its characteristics such as light weight, low-voltage dc drive, and rapid response, the organic EL element has been receiving attention as a next-generation flat panel display element. In addition, since the organic EL element is of a self-light-emitting type and has a wide viewing angle, the organic EL element has been considered useful for display screens of portable devices.

In the organic EL element, an electron injected from a cathode and a hole injected from an anode are recombined to form an exciton, and the exciton releases energy to emit light when returning to the normal state. Possible excited states include a singlet state (S*) and a triplet state (T*). Their statistical generation rate is considered as S*: T*=1:3 (Reference 1: Tetsuo Tsutsui, "3rd Lecture Text, Organic Molecular Electronics and Bioelectronics Division, The Japan Society of Applied Physics" p. 31 (1993)).

In general organic compounds, however, no light emission (phosphorescence) is observed in the triplet excited state (T*) at room temperature. This is also true for the organic EL element. Usually, only light emission (fluorescence) in the singlet excited state (S*) is observed. Hence, the theoretical limit of internal quantum efficiency (a ratio of generated photons to injected carriers) in the organic EL element has been considered to be 25% on the basis of S*: T*=1:3.

Not all the generated light is released to the outside of the organic EL element. Part of the light cannot be extracted due to the refractive indices inherent to components (an organic EL film, electrodes, and a substrate) of the organic EL element. The ratio of light extracted to the outside of the organic EL element to the generated light is called light extraction efficiency. The efficiency is said to be about 20%.

For the reasons described above, it has been said that the theoretical limit of the ratio of photons that eventually can be extracted to the outside of the organic EL element to the number of injected carriers (hereinafter referred to as "external quantum efficiency") is 25%×20%=5% even when all the injected carriers form excitons. In other words, even when all the carriers are recombined, mathematically only 5% of them can be extracted as light.

Recently, however, organic EL elements that can convert triplet excitation energy into emission light have been presented one after another and their high light-emitting efficiencies are receiving attention (Reference 2: D. F. O'Brien, M. A. Baldo, M. E. Thompson and S. R. Forrest, "Improved energy transfer in electrophosphorescent devices", Applied Physics Letters, vol. 74, No. 3, 442–444 (1999); Reference 3: Tetsuo Tsutsui, Moon-Jae Yang, Masayuki Yahiro, Kenji Nakamura, Teruichi Watanabe, Taishi Tsuji, Yoshinori Fukuda, Takeo Wakimoto and Satoshi Miyaguchi, "High Quantum Efficiency in Organic Light-Emitting Devices with Iridium-Complex as a Triplet Emissive Center", Japanese journal of Applied Physics, Vol. 38, L1502–L1504 (1999)).

A metal complex containing platinum as a central metal (hereinafter referred to as a "platinum complex") is used in Reference 2, and a metal complex containing iridium as a central metal (hereinafter referred to as an "iridium complex") is used in Reference 3. It can be said that both the metal complexes are characterized in that a third transition series element is introduced as the central metal. The metal complexes include those having a theoretical limit value of the above-mentioned external quantum efficiency of well over 5%.

As described in References 2 and 3, the organic EL element that can convert triplet excitation energy into emission light can achieve higher external quantum efficiency than that in prior art. In addition, emission luminance also increases with the increase in the external quantum efficiency. Hence, conceivably, the organic EL element that can convert triplet excitation energy into emission light plays an important role in the future development as an approach for achieving high luminous light emission and high light-emitting efficiency.

Materials forming the organic EL layer include low molecular weight materials and polymer materials when being broadly divided into two types. Here, the low molecule denotes a substance composed of monomers.

Since the above-mentioned platinum complex and iridium complex are monomers, they are included in the low molecular weight materials and usually are deposited by vacuum deposition. More accurately, it can be said that currently, there exists no deposition method other than the vacuum deposition. The vacuum deposition is advantageous in that a conventional shadow mask technique can be used when the film to be formed is to be patterned. In addition, there is also an advantage that the purity of materials can be maintained, since the vacuum deposition is a dry process in vacuum.

In the case of using the vacuum deposition, however, with respect to the material itself that is to be deposited, the amount of the material that is not deposited on a target but adheres to the inner side of a chamber is wasted. Hence, the vacuum deposition is not cost-efficient by no means. In addition, since the size of a substrate is limited in the conventional vacuum deposition technique, slight concern still remains with respect to the increase in area of the substrate.

Furthermore, for the low molecular weight organic EL layer formed by the vacuum deposition, a codeposition method is often used to dope the layer with a trace amount of pigment. However, there is also a disadvantage that it is technically difficult to codeposit a plurality of dopants with a host material at a time and besides at a constant rate.

On the other hand, there are some deposition methods in the case of using the polymer materials. Currently, the most convenient and general deposition method is spin coating. The spin coating has a disadvantage in that about 95% of a material is wasted, but has an advantage in that the increase in area can be achieved easily in the case of a monochromatic light emitting element produced using a single material.

With respect to doping, it is possible to carry out simultaneous doping with a plurality of dopants through proper preparation of solutions. In addition, it is also possible to carry out doping easily with pigments that cannot be used for doping by the vacuum deposition.

Furthermore, a precise patterning technique, which is difficult to be carried out by the spin coating, has been improved through the recent study and development of a technique of patterning a polymer material using an ink jet device (Reference 4: Japanese Patent Application Laid-open No. Hei 10-012377; and Reference 5 Japanese Patent Application Laid-open No. Hei 10-153967). When using this technique, the increase in area can be achieved more easily as compared to the case of the vacuum deposition of a low molecular weight material, and in addition, little material is wasted. Hence, in the future, there is a possibility that the polymer materials may become advantageous in terms of the increase in area and cost reduction.

Furthermore, the organic EL layer made of a polymer material (hereinafter referred to as a "polymer EL layer") has advantages in, for example, being excellent in heat resistance and mechanical strength as compared to the organic EL layer formed using a low molecular weight material. The excellent heat resistance makes crystallization difficult to occur and thus allows devices to have high reliability. Moreover, in the future, if a film-shaped light emitting device with a flexible substrate is developed, high mechanical strength and reliability become important.

For the reasons described above, in the present situation, it is desirable to develop an organic EL element that includes a polymer EL layer and can convert triplet excitation energy into emission light. However, in organic EL elements including polymer EL layers, no emission light has been observed yet in the triplet excited state. Hence, under the present situation, the light-emitting efficiency of the organic EL elements with polymer EL layers is lower than the highest light-emitting efficiency of organic EL elements produced using low molecular weight materials.

SUMMARY OF THE INVENTION

The present invention is intended to obtain an organic EL layer that can convert triplet excitation energy into emission light, using a polymer material. Based on this, it is also an object of the present invention to provide an organic EL element with high light-emitting efficiency and higher mechanical and thermal reliability than that in a conventional organic EL element.

Furthermore, it is an object of the present invention to provide a light emitting device that is bright, requires low power consumption, and also is excellent in mechanical and heat resistant properties, using an organic EL element obtained through implementation of the present invention. Moreover, by using such a light emitting device for a light source or a display portion, electric apparatuses can be obtained that are bright, require low power consumption, and have long lives.

The present inventors paid attention to the heavy atom effect known in the photo-luminescence (hereinafter referred to as "PL") field. The heavy atom effect indicates that introduction of a heavy atom (an atom having heavy nucleus weight) into a molecule or a solvent enhances the spin-orbit interaction to promote phosphorescence emission. The nucleus weight corresponds to the atomic number, i.e. the number of positive electric charges of the atomic nucleus.

The heavy atom effect includes two types of effects, the internal heavy atom effect and the external heavy atom effect. The internal heavy atom effect denotes that phosphorescence emission is promoted when a heavy atom is contained in a molecule of a light emitting material. On the other hand, there are cases where the promotion of phosphorescence emission of a light emitting material may be observed even when a heavy atom is present in a solvent containing the light emitting material as a solute. This phenomenon is called the external heavy atom effect.

The present inventors assumed that an organic EL element including a polymer EL layer can also convert triplet excitation energy into emission light as in the case of PL through the introduction of the internal or external heavy atom effect.

Methods of introducing a heavy atom into a polymer material are broadly divided into two methods. One is a method of introducing a heavy atom directly onto a main or side chain of a polymer. The other is a method of doping a polymer material with a heavy atom or a compound containing a heavy atom.

Based on the foregoing, the present invention is characterized in that as a method of introducing the heavy atom effect, a polymer material with a heavy atom introduced onto a chain or a polymer material doped with a compound containing a heavy atom is used for an organic EL element. In both the materials, examples of the heavy atom may include halogen elements (particularly, bromine or iodine), metallic elements, and the like. Rare gas elements can also be used, which will be described later.

Initially, the description is directed to a method of introducing a heavy atom directly on a main or side chain. Actually, however, it is difficult to introduce a heavy atom to replace a carbon atom on a main chain. Hence, it was assumed that the heavy atom effect can be expected to be obtained through the introduction of a metallic atom into the center of a ring when a substituent having a ring structure such as a porphyrin skeleton is introduced onto a side chain.

Further, the introduction of a heavy atom onto a main chain is also possible in the case of a polymer material having a ring structure in a main chain such as a phthalocyanine polymer. Similarly in this case, the heavy atom effect can be expected to be obtained based on the same reason as that in the case of the polymer with the porphyrin skeleton described above.

On the basis of the idea of introducing a heavy metal, the present inventors consider that the structure is also effective in which a metallic atom is bonded directly to a carbon atom as in the case of an organic metal.

Conceivably, the polymer material having the heavy atom directly on the main or side chain as described above can be used as both a light emitting material itself and a host material or a carrier transporting layer for a light emitting material. In the former case, the internal heavy atom effect can be expected to be obtained, and in the latter case, the external heavy atom effect on the light emitting material can be expected to be obtained.

The above description was directed to methods of introducing a heavy atom directly onto a chain of a polymer. Next, the following description is directed to a method of doping a polymer material with a heavy atom or a compound containing a heavy atom.

Doping methods include, for example, chemical doping and electrochemical doping. In the chemical doping, a dopant is allowed to react with a polymer material in a vapor phase or in a solution. In the electrochemical doping, doping is carried out electrochemically using a polymer material as an electrode. Furthermore, ion implantation can also be used in which ions accelerated by an electric field are implanted into a material and thus the surface modification or doping is carried out.

The chemical doping or electrochemical doping is substantially equivalent to the diffusion of dopant molecules. For example, when halogen molecules are used for the chemical doping, it is conceivable to use a method of exposing a polymer material to a vapor of various halogen molecules (for example, iodine molecules) and thus allowing the halogen molecules to diffuse into the polymer material. When a polymer as a host material (hereinafter referred to as a "matrix polymer") and dopant molecules can be dissolved in one solvent, doping can be carried out easily with both the matrix polymer and the dopant molecules dissolved in the solvent.

These doping methods have an advantage of extreme simplicity in terms of the process. On the other hand, however, since they utilize the diffusion of the dopant, dopant molecules can move around inside the matrix polymer to some degree even after the doping. Hence, it may be said that they are insecure in providing a completed device with stability. In addition, when a dense crystalline polymer is used as the matrix polymer, there is a disadvantage that it is difficult for a dopant to diffuse and this conversely causes difficulty in doping.

Next, the description is directed to ion implantation as a doping method. In the ion implantation, caution is required since a polymer chain may be cleaved by being attacked by high energy ions and thus the material surface may considerably be deteriorated or carbonized. In this case, however, the selection of suitable conditions makes doping possible.

In the case of the ion implantation, since arbitrary atoms are implanted into a polymer material in a non-equilibrium state, the diffusion of the implanted atoms is restricted considerably. In addition, the selection of the acceleration voltage to be applied to ions and atoms to be implanted allows implantation thickness to vary. Hence, if these conditions are determined strictly, a stable device can be obtained.

The problem that may arise here is the tendency of conductivity to increase with the increase in doping amount in many cases even when using any of the above-mentioned doping methods. With the increase in conductivity, the possibility increases that a doped polymer material does not function as a light emitting layer where carriers are recombined.

Hence, the following method is preferable. That is, a polymer material with a heavy atom introduced thereto by doping is used as a carrier transporting layer disposed in contact with a light emitting layer to obtain the external heavy atom effect on the light emitting layer. Possible layer structures include those obtained by a method of providing a doped polymer layer to be adjacent to a light emitting layer having a carrier transporting property, or a method of interposing a light emitting layer between doped polymer layers.

However, there is a report that only when rare gas (for instance, argon or krypton) atoms are implanted, the surface alone is carbonized to become electrically conductive, but the inner portion does not become electrically conductive. Thus, in this case, it is considered that the doped polymer material can be used as a light emitting layer by using the carbonized surface as a joint surface to be brought into contact with an electrode.

As described above, in an organic EL element including a polymer EL layer, the light-emitting efficiency of the organic EL element may be improved through the introduction of the heavy atom effect as compared to that in the conventional case. As a result, a low-power-consumption light emitting device can be obtained. Furthermore, since the organic EL layer is formed of a polymer material, a light emitting device can be obtained which is excellent in heat resistance and mechanical characteristics.

DETAILED DESCRIPTION OF THE PREFERRED EMBODIMENTS

Organic EL elements containing polymer materials having metal atoms on their main chains or side chains expressed by the following general formulae 1 and 2 (chemical formula 1–2) can convert triplet excitation energy into emission light.

[Chemical Formula 1]

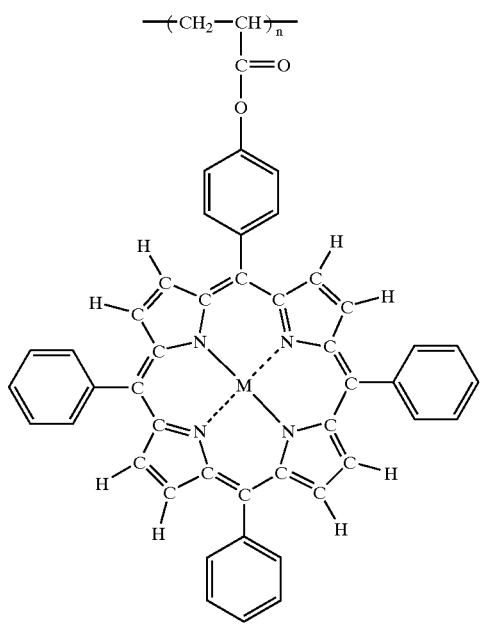

(In the polymer compound expressed by the above-mentioned general formula 1, M indicates a bivalent transition series element, and n denotes a polymerization degree (n=an integer of 2 or larger)).

[Chemical Formula 2]

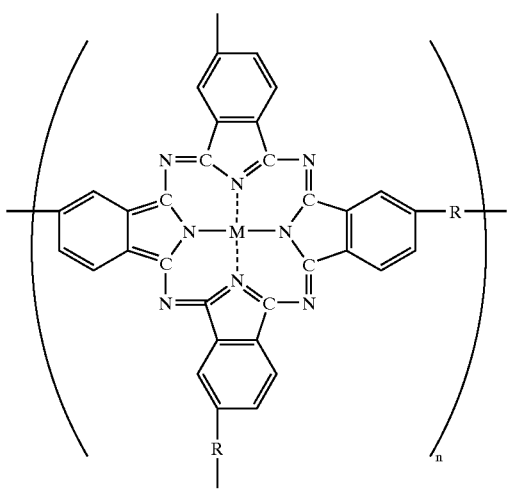

(In the polymer compound expressed by the above-mentioned general formula 2, R indicates a substituent containing a carbonyl group, a substituent containing a benzene ring, or an unsaturated-chain-type substituent containing olefin double bond; M indicates a bivalent transition series element; and n denotes a polymerization degree (n=an integer of 2 or larger)).

In the above-mentioned general formulae 1 and 2, from the viewpoint of the heavy atom effect, particularly rhodium, palladium, silver, iridium, platinum, or gold is preferable as the central metal M.

A polymer material having the structure expressed by each of the general formulae 1 and 2 (hereinafter referred to as "metal-containing polymers") can be used as a light emitting layer, a host material for a light emitting material, or a carrier transporting layer adjacent to a light emitting layer. The element structures are described as follows.

Figure 1A:
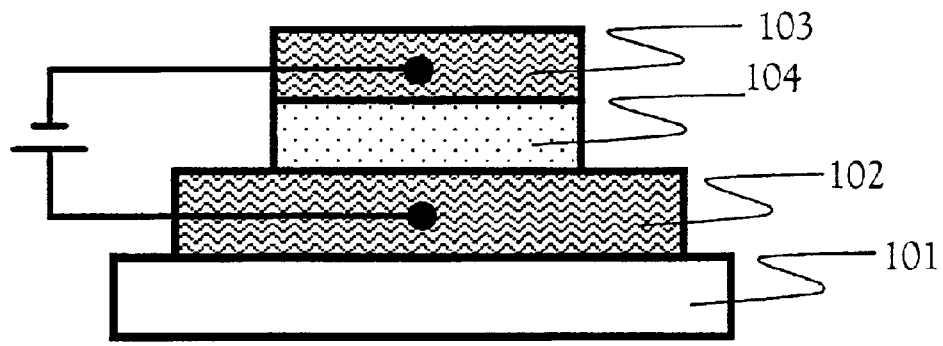
FIGS. 1A to 1C are diagrams showing configurations of organic EL elements according to embodiments of the present invention.
Figure 1B:
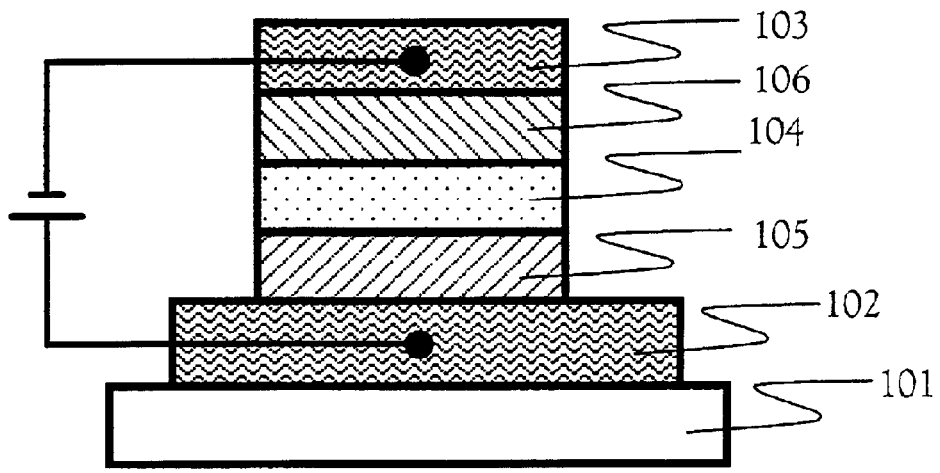
Figure 1C:
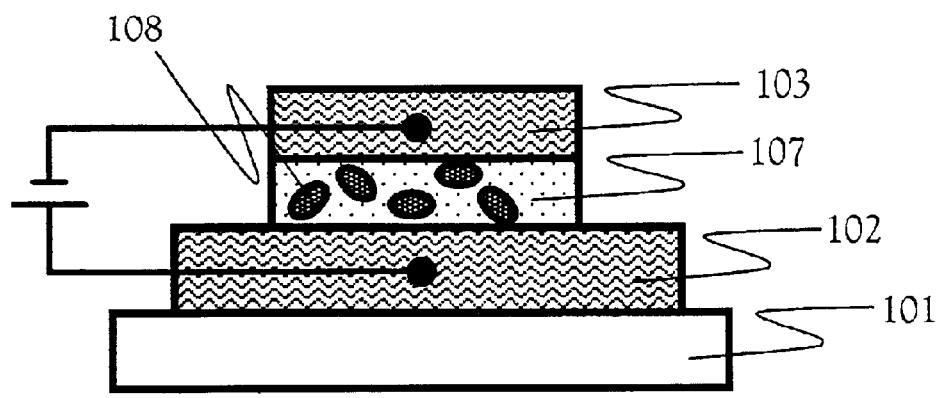

As shown in FIG. 1A, when the metal-containing polymer is used as a light emitting layer, a single layer structure may be employed in which a metal-containing polymer light emitting layer 104 alone is interposed between electrodes. Alternatively, a laminated structure may be used in which the metal-containing polymer light emitting layer is provided to be in contact with a hole transporting layer or an electron transporting layer. As an example, FIG. 1B shows a structure with the metal-containing polymer light emitting layer 104 interposed between a hole transporting layer 105 and an electron transporting layer 106. In addition, as shown in FIG. 1C, it is also possible to dope a matrix polymer 107 with a metal-containing polymer and to allow the metal-containing polymer to emit light as a dopant 108. Note, reference numeral 101 indicates a substrate layer; 102, an anode layer; 103, a cathode layer.

Figure 2A:
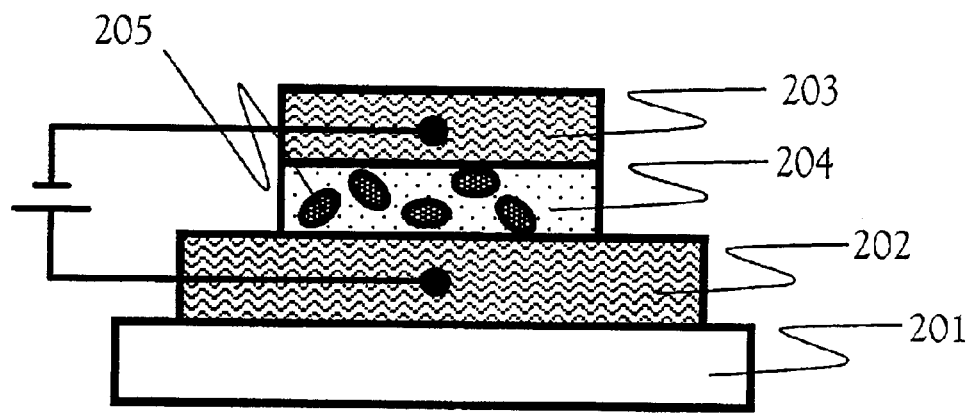
FIGS. 2A and 2B are diagrams showing configurations of organic EL elements according to further embodiments of the present invention.

Next, the following description is directed to the case where a metal-containing polymer is not used as a light emitting layer but as a host material for a light emitting material or as a carrier transporting layer. As shown in FIG. 2A, when a metal-containing polymer layer 204 has a carrier transporting property, it is also effective to dope the metal-containing polymer layer 204 with a pigment 205 and to allow the pigment 205 to emit light. In this case, the external heavy atom effect can be utilized. However, it can be considered as the greatest advantage that emission light colors of various pigments can be derived irrespective of the emission light color of the metal-containing polymer provided that the triplet excitation energy of the metal-containing polymer exceeds that of the pigment. Note, reference numeral 202 indicates a substrate layer; 202, an anode layer; 203, a cathode layer.

Figure 2B:
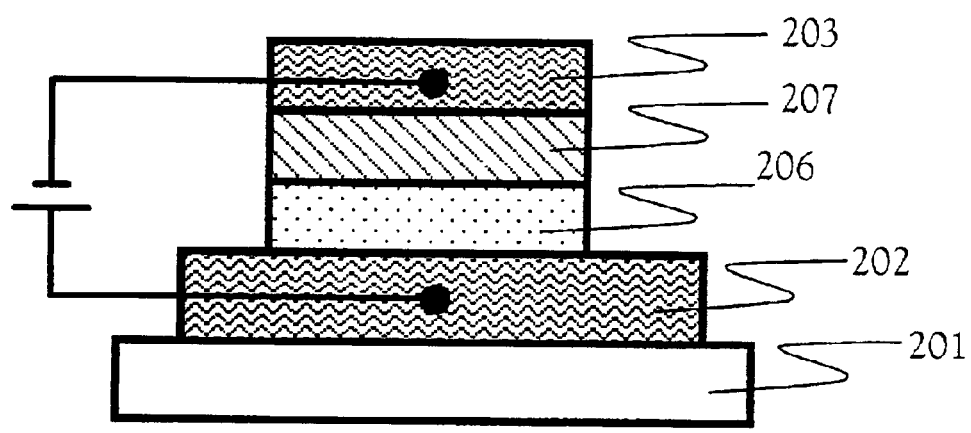

It is also possible to use a metal-containing polymer as an electron transporting layer or a hole transporting layer adjacent to a light emitting layer provided that the triplet excitation energy of the metal-containing polymer exceeds that of the light emitting layer adjacent to the metal-containing polymer. In addition, it is preferable that the metal-containing polymer have sufficiently high carrier mobility. FIG. 2B shows an example in which a hole transportable metal-containing polymer layer 206 and a light emitting layer 207 are laminated.

The above description was directed to embodiments in which a material having a heavy atom on a polymer chain is used for an organic EL element of the present invention. Next, the following description is directed to a method of using a polymer material doped with a heavy atom in the present invention.

Initially, with respect to the chemical doping with molecules containing halogen elements, it is preferable to use molecules containing bromine (Br) or iodine (I) to induce the heavy atom effect. Examples of the molecules used in this case include $Br_2$, $I_2$, ICl, $ICl_3$, IBr, $BBr_3$, and the like.

Furthermore, chemical doping with a transition metal compound is also possible. When heavier atoms than the bromine atom are to be used, known examples of such heavy atoms include $ZrCl_4$, $HfCl_4$, $NbF_5$, $NbCl_4$, $TaCl_5$, $MoF_5$, $MoCl_5$, $WF_6$, $WCl_6$, $LnCl_3$ (where Ln indicates a rare earth metal element), and the like.

Figure 3:
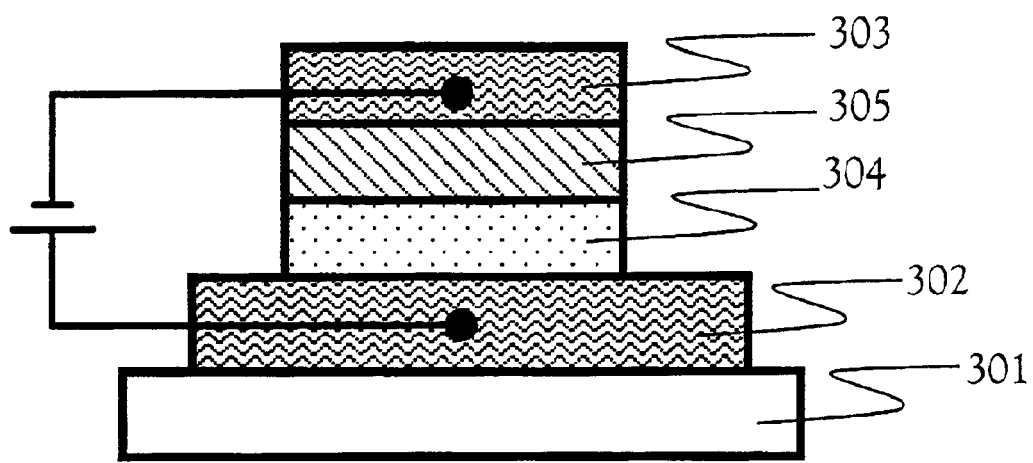
FIG. 3 is a diagram showing a configuration of an organic EL element according to another embodiment of the present invention.

The compound containing a halogen element (hereinafter referred to as a "halogen compound") or the transition metal compound described above functions as an electron-accepting (acceptor) dopant. Hence, a polymer doped with such a compound has increased conductivity and thus is considered to have an improved function particularly as a hole transporting layer. From this point of view, with consideration given to the external heavy atom effect to be exerted on a light emitting layer, a polymer doped with a halogen compound or a transition metal compound is used optimally as a hole transporting layer adjacent to the light emitting layer. The compound used for the doping possibly becomes an existence deactivating the excitation energy and hindering light emission (hereinafter referred to as a "quencher"). This is also a reason such a polymer cannot be used as the light emitting layer. FIG. 3 shows an element structure with a halogen-compound-added polymer layer 304. Note, reference numeral 301 indicates a substrate layer; 302, an anode layer; 305, a light emitting layer; 303, a cathode layer.

The following description is directed to doping with alkali metal or alkaline earth metal. In order to induce the heavy atom effect, it is preferable to use rubidium (Rb), cesium (Cs), strontium (Sr) or barium (Ba). With respect to the doping method, the electrochemical doping is optimal.

Figure 4:
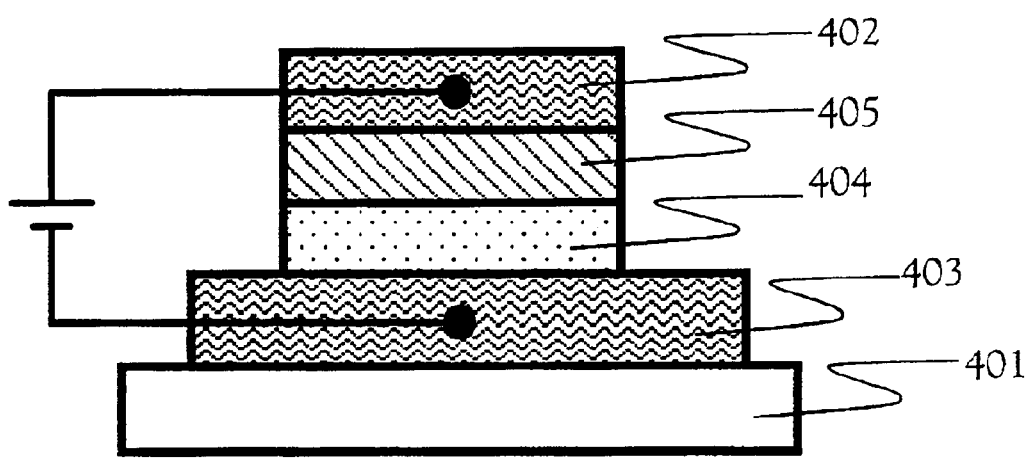
FIG. 4 is a diagram showing a configuration of an organic EL element according to still another embodiment of the present invention.

The alkali metal or alkaline earth metal described above functions as an electron donor dopant. A polymer doped with such metal should therefore have increased conductivity and thus is considered to have an improved function particularly as an electron transporting layer. Hence, with consideration given to the external heavy atom effect to be exerted on the light emitting layer, a polymer doped with alkali metal or alkaline earth metal is used optimally as an electron transporting layer adjacent to the light emitting layer. In addition, the compound used for the doping possibly becomes a quencher. This is also a reason such a polymer cannot be used as the light emitting layer. FIG. 4 shows an element structure with an alkali-metal-added polymer layer 404. Note, reference numeral 401 indicates a substrate layer; 402, an anode layer; 403, a cathode layer; 405, a light emitting layer.

FIG. 4 shows a reversed element structure in which lamination is carried out from the cathode layer side and a light emitting layer and an anode layer are laminated after doping, as compared to the structure of a usual organic EL element. The reason for using the reversed element structure is that it is necessary to carry out the doping before the lamination of the light emitting layer in order to prevent the dopant from diffusing into the light emitting layer.

The doped layers (for example, the halogen-compound-added polymer layer 304 shown in FIG. 3 and the alkali-metal-added polymer layer 404 shown in FIG. 4) can be used in combination. That is, a structure can be employed in which a polymer doped with a halogen compound or a transition metal compound is used for a hole transporting layer, a polymer doped with alkali metal or alkaline earth metal is used for an electron transporting layer, and a light emitting layer is interposed between the hole transporting layer and the electron transporting layer.

Figure 5:
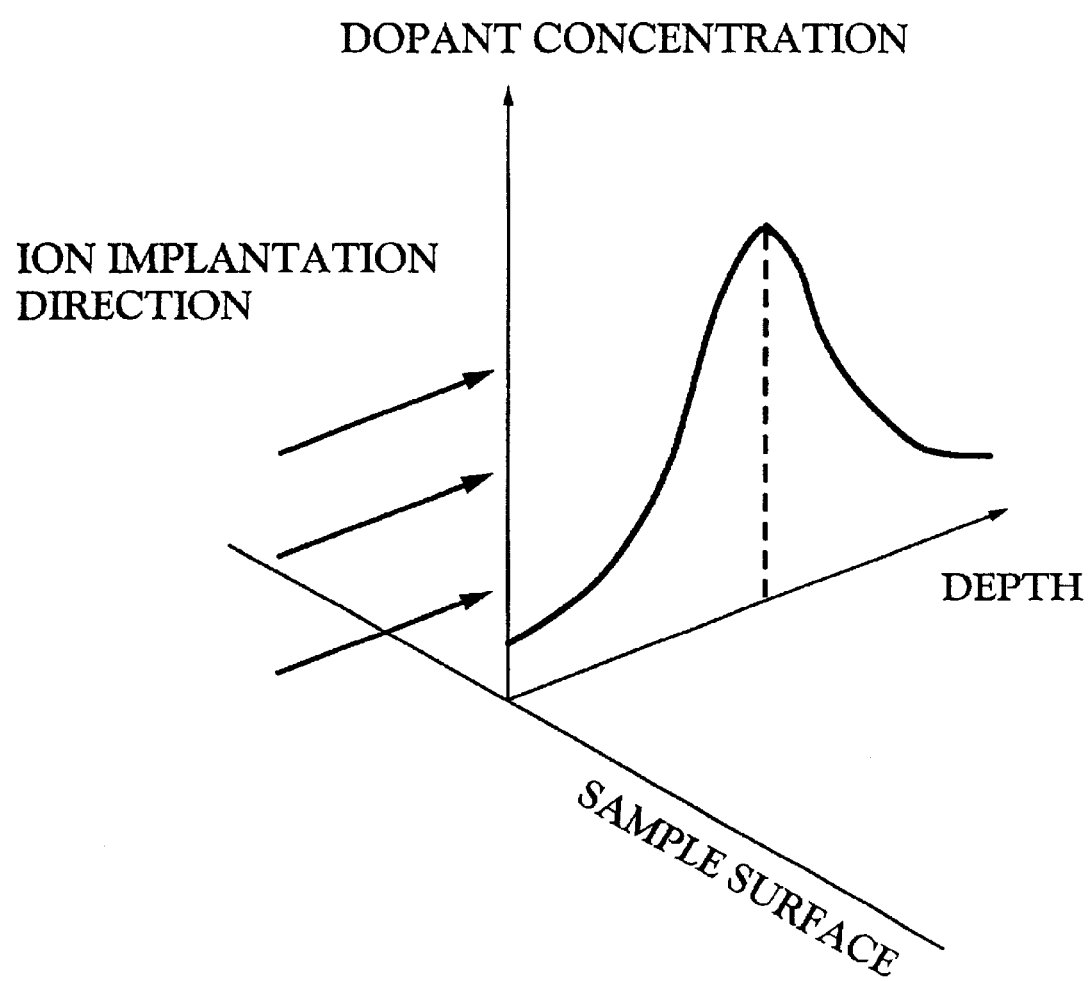
FIG. 5 is a diagram showing concentration distribution in ion implantation of the present invention.

Next, ion implantation is described as another doping method. There are a number of elements that can be used for the ion implantation. Except for the case of the implantation of rare gas atoms, however, p-type or n-type conductivity is induced as in the case of doping of inorganic semiconductor. In addition, as described before, the vicinity of the surface of the ion-implanted polymer material is carbonized to have conductivity. Further, as shown in FIG. 5, theoretically the dopant implanted into a material has Gaussian concentration distribution with respect to the depth direction. Similarly in the case of the ion implantation, the conductivity is induced except for the case of the implantation of rare gas atoms. Hence, the ion implantation is not a suitable method to be carried out with respect to the light emitting layer.

Figure 6A:
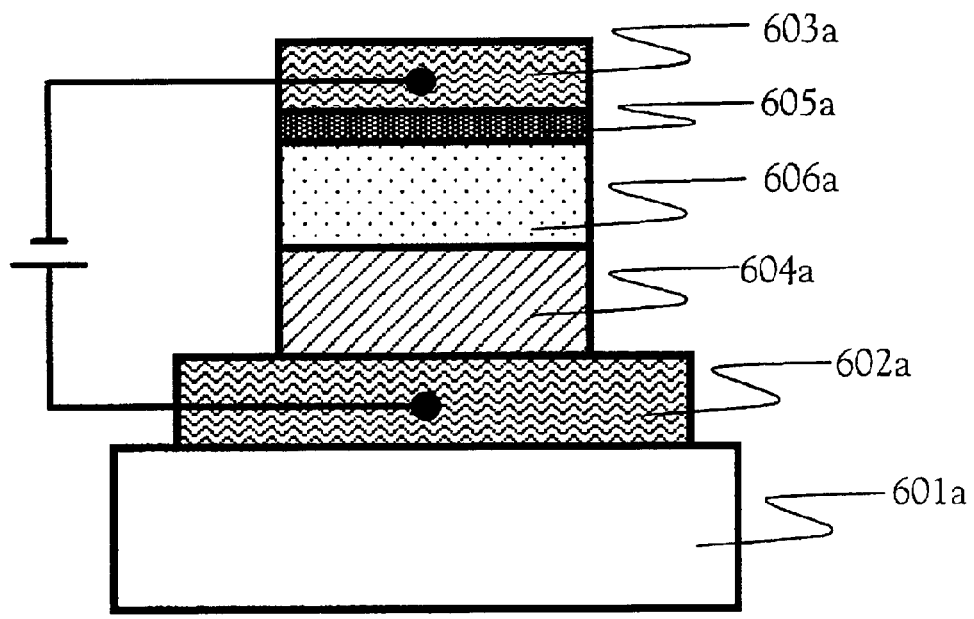
FIGS. 6A and 6B are diagrams showing configurations of organic EL elements according to embodiments of the present invention.
Figure 6B:
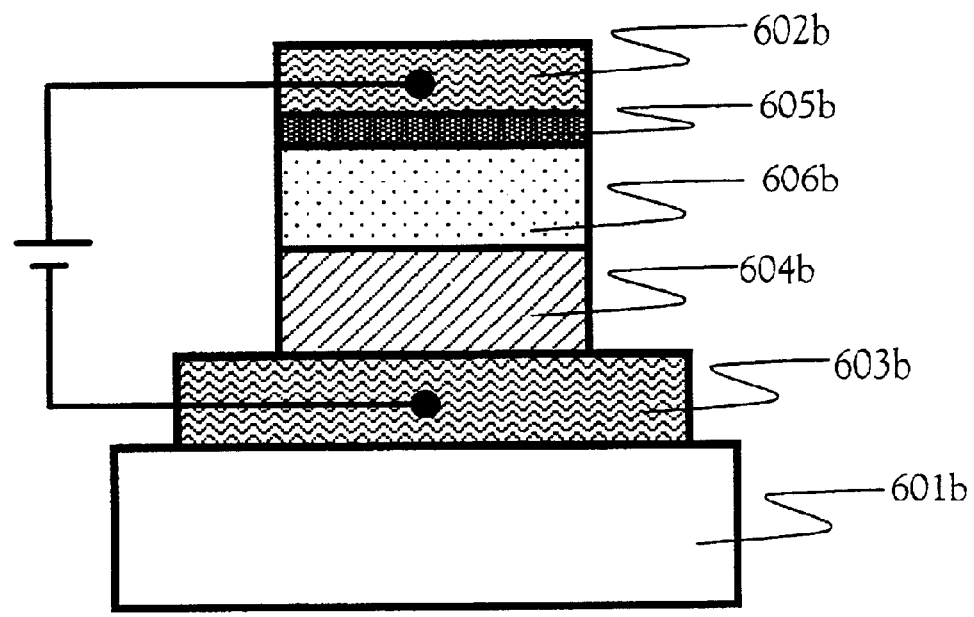

FIGS. 6A and 6B show element configurations that can be produced by the ion implantation. When consideration is given to the fact that the ion implantation is carried out after deposition of a polymer material, a layer structure is preferable in which a carbonized layer resulting from the ion implantation is in contact with an electrode.

Hence, as shown in FIG. 6A, when an n-type ion-implanted layer is to be obtained, a structure is preferable in which a layer subjected to the ion implantation is deposited on a light emitting layer 604a, then an n-type ion-implanted layer 606a is obtained by the ion implantation, and a cathode layer 603a is laminated on a carbonized layer 605a produced at the surface of the n-type ion-implanted layer 606a. A hole transporting layer may be or may not be present between an anode layer 602a and the light emitting layer 604a. Note, reference numeral 601a indicates a substrate layer.

As shown in FIG. 6B, when a p-type ion-implanted layer is to be obtained, contrary to a usual organic EL element, the structure obtained by the following method is preferable. That is, after a cathode layer 603b and a light emitting layer 604b are laminated sequentially, a layer subjected to the ion implantation is deposited on the light emitting layer 604b; a p-type ion-implanted layer 606b is obtained by the ion implantation; and an anode layer 602b is laminated on a carbonized layer 605b produced at the surface of the p-type ion-implanted layer 606b. In this case, an electron transporting layer may be or may not be present between the cathode layer 603b and the light emitting layer 604b. Note, reference numeral 601b indicates a substrate layer.

When light atoms are to be implanted, the distribution width in the depth direction increases and thus an increased amount of dopant passes through to the light emitting layer. However, the distribution width decreases with the increase in weight of atoms to be implanted, which results in a sharp distribution. In this case, the dopant hardly passes through to the light emitting layer. In the present invention, the use of heavy atoms is an essential point and is considered suitable.

When rare gas atoms are used as a dopant, a carbonized layer is produced in the vicinity of the surface and thus the vicinity of the surface is provided with conductivity. However, no n-type or p-type conductivity is provided in the doped region under the carbonized layer. Hence, in the case where the doping is carried out with rare gas atoms, the light emitting layer can also be doped.

[Embodiment 1]

This embodiment specifically exemplifies a polymer material expressed by the general formula 1 according to the embodiment mode of the present invention, and the description is also directed to production of an organic EL element using the polymer material. For the structure of the element, the structure shown in FIG. 1C is used.

The polymer material used in this embodiment is a metal-containing polymer having platinum as a central metal of a porphyrin skeleton (hereinafter referred to as a "Pt polymer") and is expressed by the following constitutional formula 3.

[Chemical Formula 3]

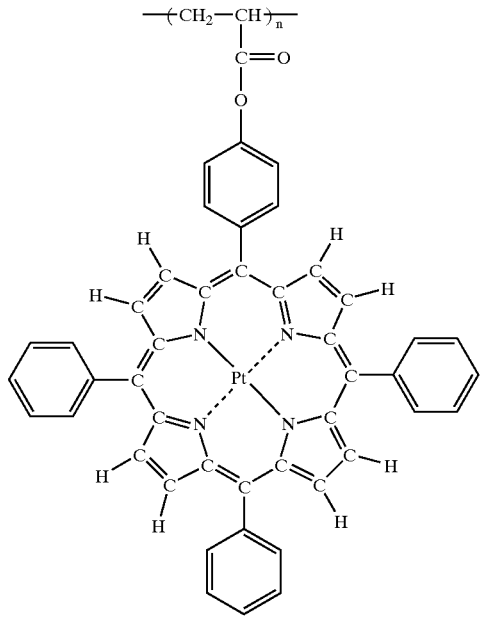

Figure 7:
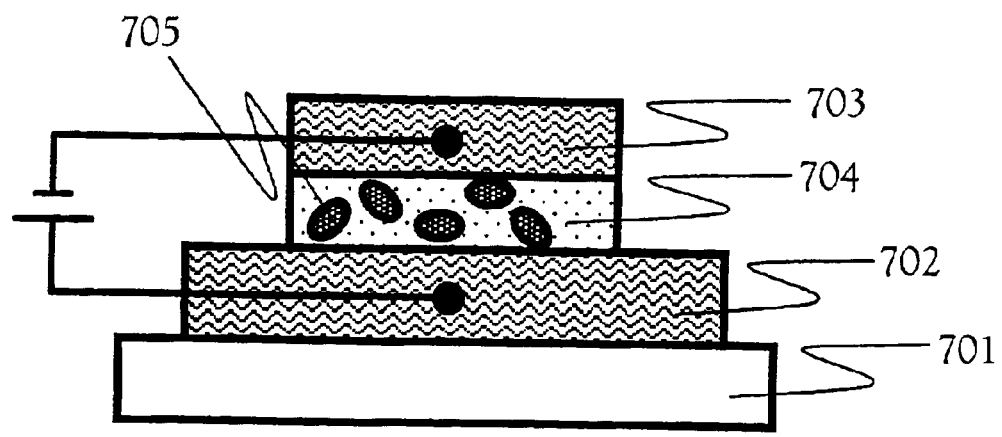
FIG. 7 is a diagram showing a specific example of a configuration of an organic EL element according to Embodiment 1.

Among low molecular weight materials, the platinum complex described in Reference 2 has the porphyrin skeleton and is an organic material that can convert triplet excitation energy into emission light. In Reference 2, however, the platinum complex is used as a dopant. Hence, in the present example, it is considered suitable that the Pt polymer is used as a dopant to disperse in a matrix polymer and thus the matrix polymer doped with the Pt polymer is obtained to be used as a light emitting layer. FIG. 7 shows the element structure in this case.

A polymer with high carrier mobility may be used as a matrix polymer 704. In this case, however, it is an essential condition that the triplet excitation energy of the matrix polymer 704 is higher than that of a Pt polymer 705. Note, reference numeral 701 indicates a substrate layer; 702, an anode; 703, a cathode.

For an anode 702, indium oxide, tin oxide, zinc oxide, or a compound thereof (such as ITO) is used typically as a transparent electrode. A gold thin film or the like can also be used as a transparent electrode. A general film deposition method is sputtering, but the vacuum deposition can also be used. The same is true for the anodes in the following embodiments.

For a cathode 703, a metal with a small work function is used and generally is alkali metal, alkaline earth metal, or an alloy containing such metal. In addition, rare earth metal such as ytterbium can also be used for the cathode 703. Generally, the vacuum deposition is used as the film deposition method in this case. The same is true for the cathodes in the following embodiments.

[Embodiment 2]

This embodiment specifically exemplifies a polymer material expressed by the general formula 2 according to the embodiment mode of the present invention. In this embodiment, the description is also directed to production of an organic EL element using the polymer material. For the structure of the element, the structure shown in FIG. 2B is used.

The polymer material used in this embodiment is a metal-containing polymer having palladium as a central metal of a phthalocyanine skeleton (hereinafter referred to as a "Pd polymer") and is expressed by the following constitutional formula 4.

[Chemical Formula 4]

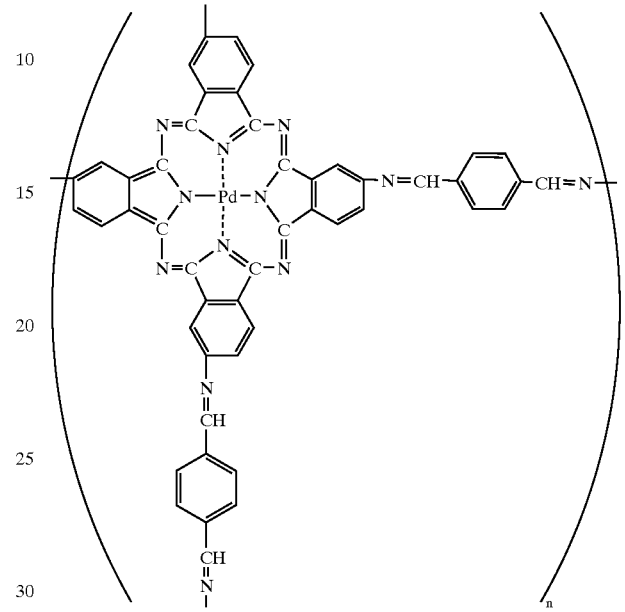

Figure 8:
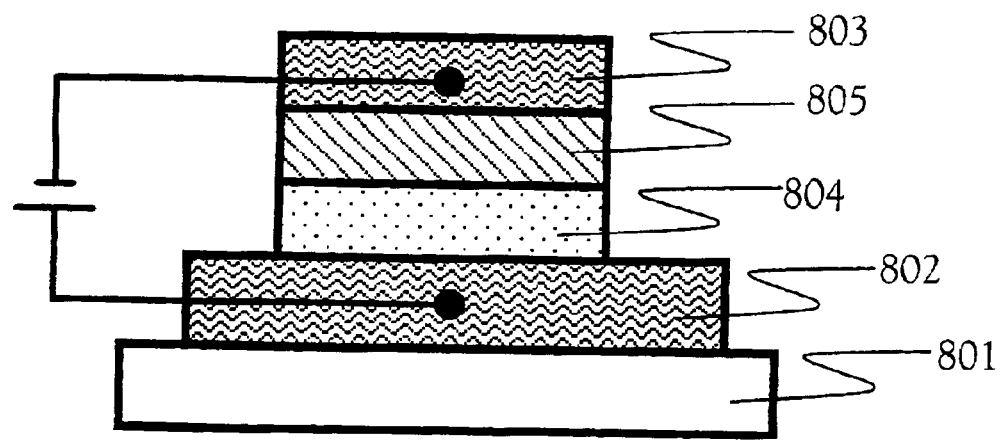
FIG. 8 is a diagram showing another specific example of a configuration of an organic EL element according to Embodiment 2.

Among low molecular weight materials, a phthalocyanine compound is often used for a hole injecting layer. As shown in FIG. 8, this embodiment is directed to an example in which a Pd polymer 804 is deposited as a hole injecting layer on an anode 802 and further a light emitting layer 805 is laminated thereon. For the light emitting layer 805, known light emitting materials may be used including poly (paraphenylene vinylene) (hereinafter referred to as "PPV") expressed by the following chemical formula 5 and poly(N-vinylcarbazole) (hereinafter referred to as "PVK") expressed by the following chemical formula 6.

[Chemical Formula 5]

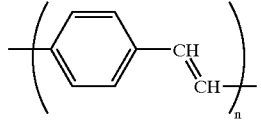

[Chemical Formula 6]

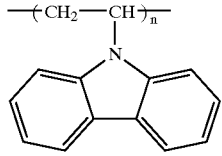

In this case, however, the Pd polymer 804 and the light emitting layer 805 may be mixed together when they are laminated using solvents having the same polarity. It therefore is preferable to use the method of depositing the Pd polymer 804 in a precursor state and then removing the solvent by heating to cause polymerization. Note, reference numeral indicates a substrate layer; 803, a cathode.

[Embodiment 3]

In this embodiment, the description is directed to production of the organic EL element shown in FIG. 3 according to the embodiment mode of the present invention. Since the polymer to be doped is located on the anode side, known hole injection materials may be used including polyaniline (hereinafter referred to as "Pani") and a polythiophene derivative (hereinafter referred to as "PEDOT"). Here, the PEDOT is used. In addition, iodine is used as the dopant for the PEDOT and PPV is used for the light emitting layer.

Figure 9:
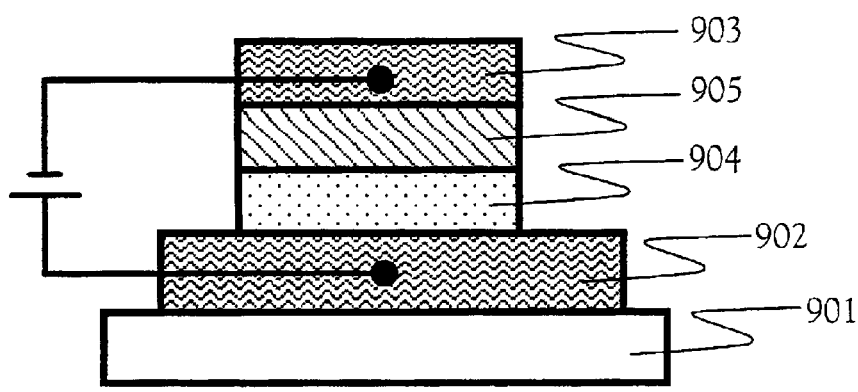
FIG. 9 is a diagram showing still another specific example of a configuration of an organic EL element according to Embodiment 3.

The element structure is shown in FIG. 9. The following production method is employed. That is, initially the PEDOT is deposited on an anode 902 and then is brought into contact with iodine vapor for a few hours. Thus, an iodine-added PEDOT 904 is obtained. Afterward, vacuum degassed is carried out to remove unreacted iodine, and then PPV 905 as a light emitting layer is deposited on the iodine-added PEDOT 904. Finally, a cathode 903 is deposited by the vacuum deposition. Note, reference numeral 901 indicates a substrate layer.

[Embodiment 4]

In this embodiment, the description is directed to production of the organic EL element shown in FIG. 4 according to the embodiment mode of the present invention. For the polymer to be doped, any polymers may be used as long as they are conductive polymers typified by π-conjugated polymers. In this case, however, since an electrochemical doping is used suitably as the doping method, polymers that can be composed by electrolytic polymerization are preferable in terms of the simplicity of the process. Here, polypyrrole is used. Barium is used as the dopant for the polypyrrole, and PPV is used for the light emitting layer.

Figure 10:
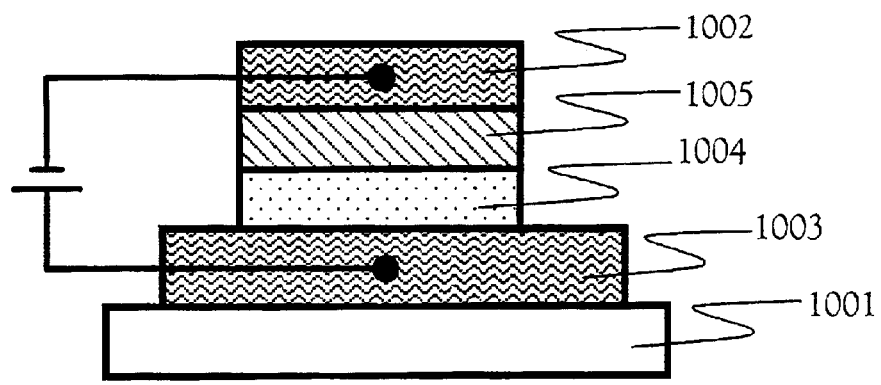
FIG. 10 is a diagram showing yet another specific example of a configuration of an organic EL element according to Embodiment 4.

The element structure is shown in FIG. 10. The following production method is employed. That is, initially a film of polypyrrole composed by electrolytic polymerization is formed on a cathode 1003. Next, using the polypyrrole film as a working electrode, a platinum plate as an opposing electrode, and $Ba/Ba^{2+}$ as a reference electrode are used, voltage is applied and thus barium-added polypyrrole is obtained. Afterward, PPV 1005 as a light emitting layer is deposited on the barium-added polypyrrole 1004. Eventually, an anode 1002 may be deposited by sputtering or vacuum deposition. Note, reference numeral indicates a substrate layer.

[Embodiment 5]

In this embodiment, the description is directed to production of the organic EL element shown in FIG. 6B according to the embodiment mode of the present invention. In the case of this embodiment, since the layer subjected to ion implantation is formed on the anode side, a hole injection material is preferable. Here, PVK is used. Iodine is used as ion species to be implanted, and PPV is used for the light emitting layer.

Figure 11:
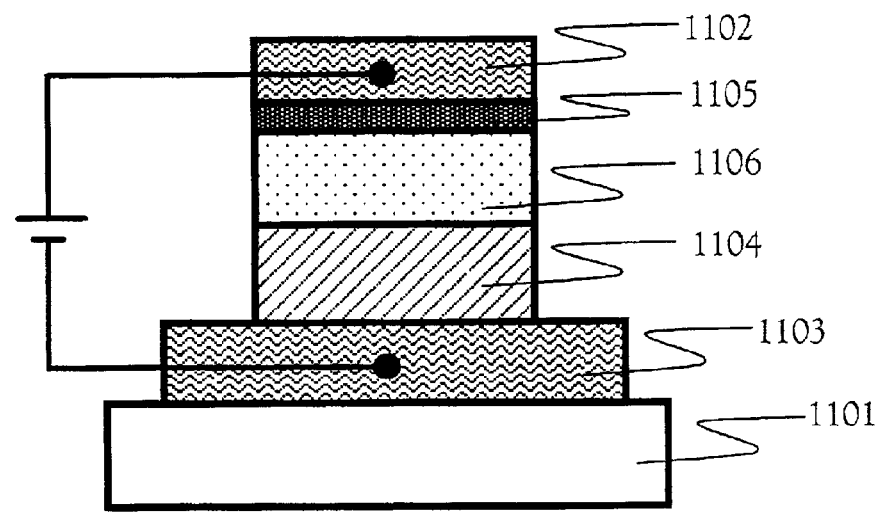
FIG. 11 is a diagram showing a further specific example of a configuration of an organic EL element according to Embodiment 5.

The element structure is shown in FIG. 11. The following production method is employed. Initially, PPV 1104 as a light emitting layer is deposited on a cathode 1103. Afterward, PVK is laminated thereon, which then is doped with iodine atoms using NaI as a raw material with an ion implantation device, and thus an iodine-implanted PVK 1106 is obtained. Since a carbonized layer 1105 is produced on the surface of the iodine-implanted PVK 1106, the PVK is required to have a thickness enough for preventing the whole PVK from being carbonized. After the ion implantation, an anode 1102 is deposited on the carbonized layer 1105. Note, reference numeral 1101 indicates a substrate layer.

[Embodiment 6]

Figure 12:
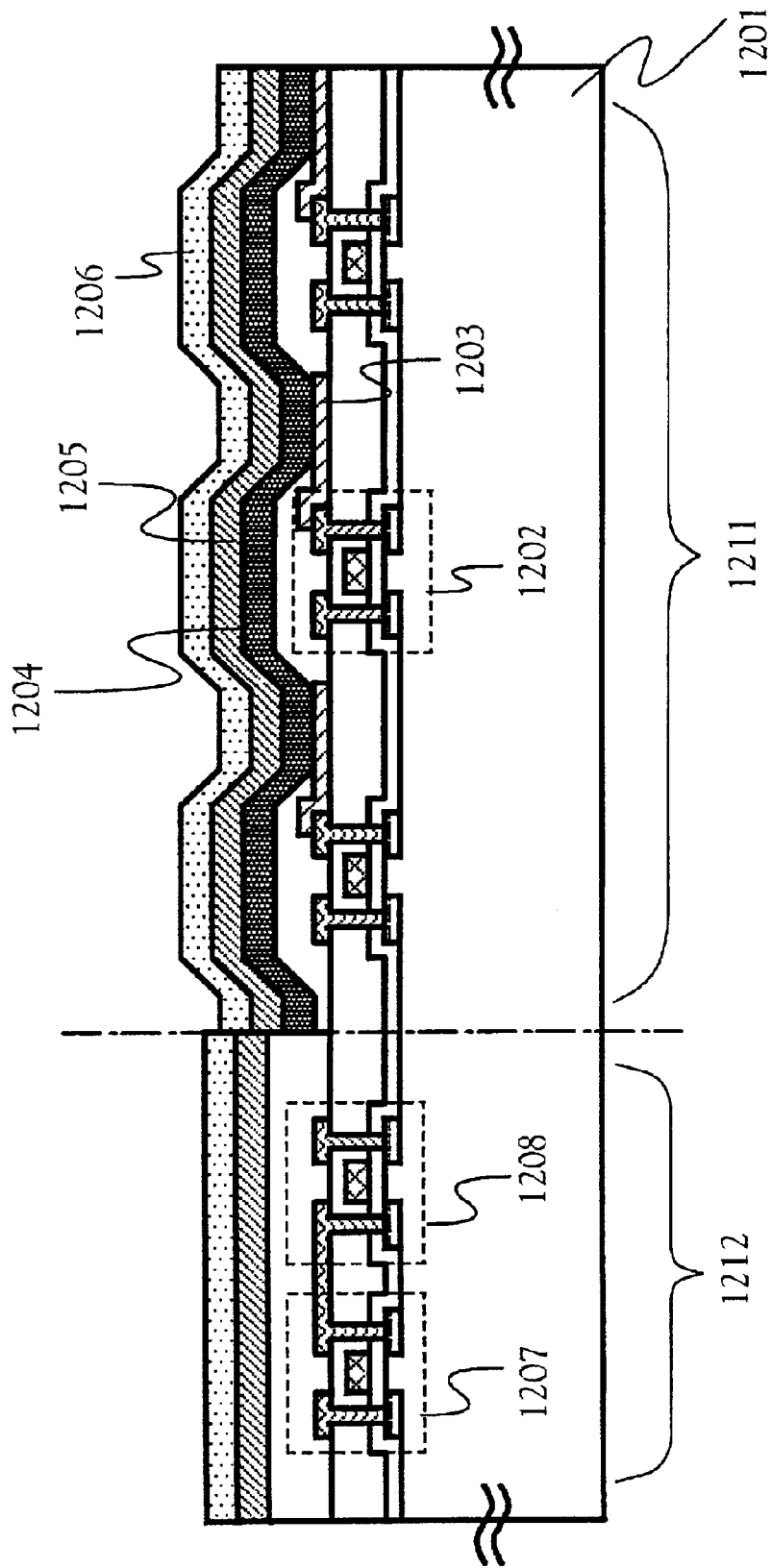
FIG. 12 is a diagram showing a cross-sectional structure of a light emitting device according to Embodiment 6.

In this embodiment, a light emitting device including an organic EL element will be described. FIG. 12 is a sectional view of an active matrix type light emitting device using the organic EL element of the present invention. Incidentally, although a thin film transistor (hereinafter referred to as a TFT) is used here as an active element, a MOS transistor may be used.

Besides, although a top gate TFT (specifically, a planar TFT) is exemplified as a TFT, a bottom gate TFT (typically, an inverted stagger TFT) can also be used.

In FIG. 12, reference numeral 1201 designates a substrate, and the substrate transparent to visible light is used here. Specifically, a glass substrate, a quartz substrate, a crystallized glass substrate, or a plastic substrate (including a plastic film) may be used. Incidentally, the substrate 1201 also includes an insulating film provided on the surface of the substrate.

A pixel portion 1211 and a driving circuit 1212 are provided on the substrate 1201. Here, first, the pixel portion 1211 will be described.

The pixel portion 1211 is a region where an image display is carried out, and includes a plurality of pixels. A TFT (hereinafter referred to as a current control TFT) 1202 for controlling a current flowing through an organic EL element, a pixel electrode (anode) 1203, a polymer EL layer 1204 and a cathode 1205 are provided for each of the pixels. Incidentally, although only the current control TFT is shown in FIG. 12, a TFT (hereinafter referred to as a switching TFT) for controlling a voltage applied to a gate of the current control TFT is provided.

As the current control TFT 1202, it is preferable to use a p-channel TFT here. Although an n-channel TFT can also be used, in the case where the current control TFT is connected to an anode of the organic EL element as in the structure of FIG. 12, the p-channel TFT can suppress power consumption more effectively. However, as the switching TFT (not shown), any of an n-channel TFT and a p-channel TFT may be used.

A pixel electrode 1203 is electrically connected to a drain of the current control TFT 1202. Here, since a conductive material having a work function of 4.5 to 5.5 eV is used as a material of the pixel electrode 1203, the pixel electrode 1203 functions as an anode of the organic EL element. As the pixel electrode 1203, typically, indium oxide, tin oxide, zinc oxide, or a compound of these (such as ITO) may be used. A polymer EL layer 1204 is provided on the pixel electrode 1203.

Next, a cathode 1205 is provided on the polymer EL layer 1204. A conductive material having a work function of 2.5 to 3.5 eV is used as a material of the cathode 1205. As the cathode 1205, typically, a conductive film containing an element in alkaline metals or alkali earth metals or a laminate of the former and aluminum alloy may be used.

The layer constituted by the pixel electrode 1203, the polymer EL layer 1204, and the cathode 1205 is covered with a protection film 1206. The protection film 1206 is provided to protect the EL element against oxygen and water. As a material of the protection film 1206, a silicon nitride film, a silicon nitride oxide film, an aluminum oxide film, a tantalum oxide film, or a carbon film (specifically, a diamond-like carbon film) is used.

Next, the driving circuit 1212 will be described. The driving circuit 1212 is a region where timings of signals (gate signals and data signals) transmitted to the pixel portion 1211 are controlled, and a shift register, a buffer, a latch, an analog switch (transfer gate), or a level shifter is provided. Here, a CMOS circuit formed of an n-channel TFT 1207 and a p-channel TFT 1208 is shown as a basic unit of these circuits in FIG. 12.

Incidentally, the circuit structure of the shift register, buffer, latch, analog switch (transfer gate) or level shifter may be a well-known one. In FIG. 12, although the pixel portion 1211 and the driving circuit 1212 are provided on the same substrate, it is also possible to electrically connect an IC or LSI without providing the driving circuit 1212.

Here, in FIG. 12, although the pixel electrode (anode) 1203 is electrically connected to the current control TFT 1202, a structure can also be adopted in which a cathode of the EL element is electrically connected to the current control TFT. In that case, it is appropriate that the pixel electrode is formed of the same material as the cathode 1205, and the cathode is formed of the same material as the pixel electrode 1203. In that case, it is preferable that the current control TFT is made an n-channel TFT.

Figure 13A:
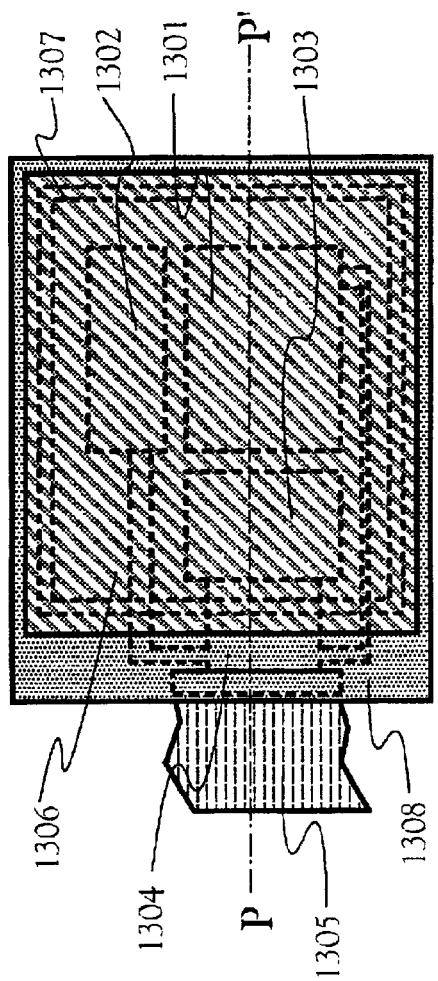
FIGS. 13A and 13B are diagrams showing a top surface structure and a cross-sectional structure, respectively, of a light emitting device according to Embodiment 6.
Figure 13B:
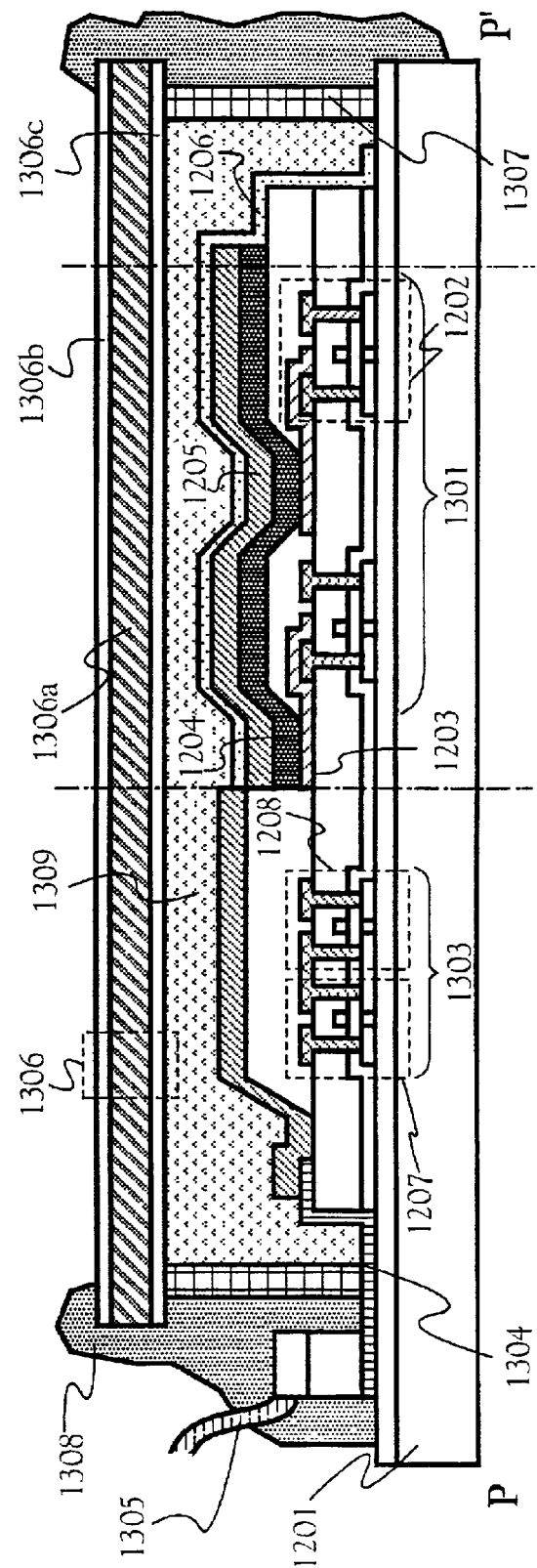

Here, external appearance views of the active matrix type light emitting device shown in FIG. 12 are shown in FIGS. 13A and 13B. FIG. 13A is a top view and FIG. 13B is a sectional view taken along P–P' of FIG. 13A. Besides, symbols of FIG. 12 are used.

In FIG. 13A, reference numeral 1301 designates a pixel portion; 1302, a gate signal side driving circuit; and 1303, a data signal side driving circuit. Signals transmitted to the gate signal side driving circuit 1302 and the data signal side driving circuit 1303 are inputted through an input wiring line 1304 from a TAB (Tape Automated Bonding) tape 1305. Incidentally, although not shown, instead of the TAB tape 1305, a TCP (Tape Carrier Package) in which an IC (Integrated Circuit) is provided on a TAB tape may be connected.

At this time, reference numeral 1306 designates a cover member provided over the organic EL element shown in FIG. 12, and is bonded through a sealing member 1307 made of resin. As the cover member 1306, any material may be used as long as oxygen and water does not permeate through it. Here, as shown in FIG. 13B, the cover member 1306 is formed of a plastic member 1306a and carbon films (specifically diamond-like carbon films) 1306b and 1306c provided on the outside surface and the inside surface of the plastic member 1306a.

Further, as shown in FIG. 13B, the seal member 1307 is covered with a sealing member 1308 made of resin, and the organic EL element is completely sealed in an airtight space 1309. At this time, the airtight space 1309 may be filled with an inert gas (typically, a nitrogen gas or a rare gas), a resin, or an inert liquid (typically, liquid carbon fluoride typified by perfluoroalkane). Further, it is also effective to provide a moisture absorbent or a deoxidation agent.

Besides, a polarizing plate may be provided on a display surface (surface on which an image is observed) of the light emitting device shown in this embodiment. This polarizing plate has an effect to suppress reflection of light incident from the outside, and to prevent an observer from being reflected on the display surface. In general, a circular polarization plate is used. However, in order to prevent light emitted from the organic EL layer from being returned to the inside through reflection by the polarizing plate, it is desirable to form a structure having low inner reflection by adjusting refractivity.

Incidentally, for the organic EL element included in the light emitting device of this embodiment, any of the organic EL element of the present invention may be used.

[Embodiment 7]

Figure 14A:
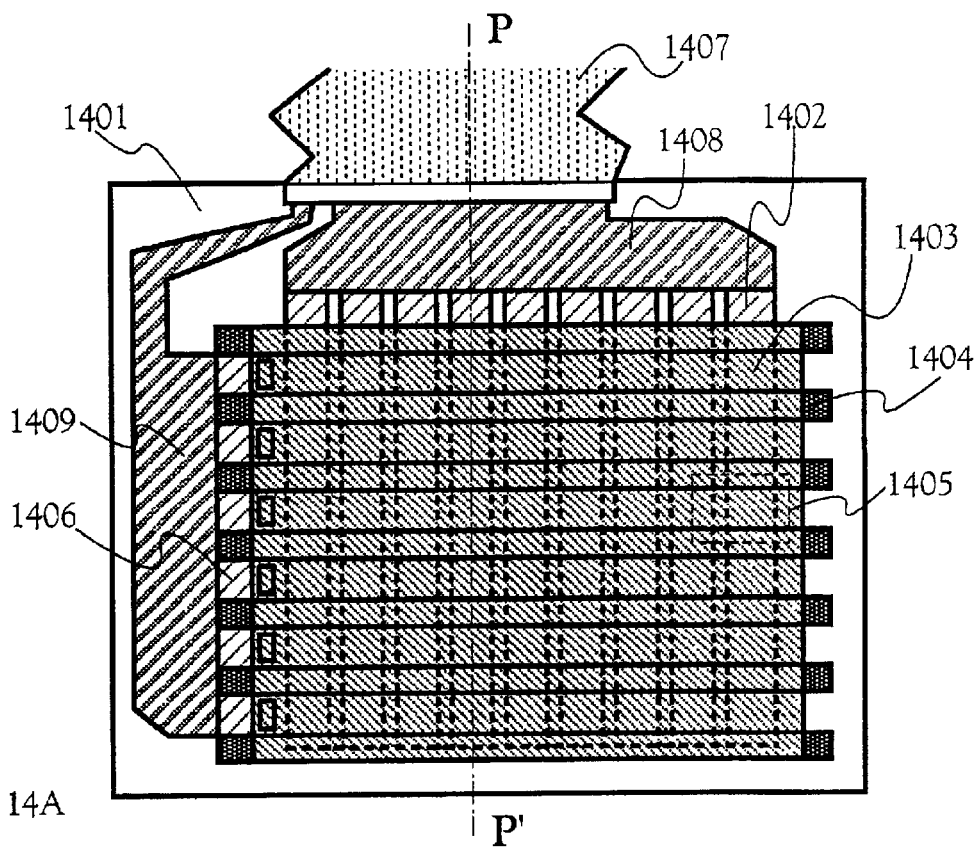
FIGS. 14A, 14B, and 14C are diagrams showing a top surface structure, a cross-sectional structure, and a partially enlarged view of the cross-sectional structure, respectively, of a light emitting device according to Embodiment 7.
Figure 14B:
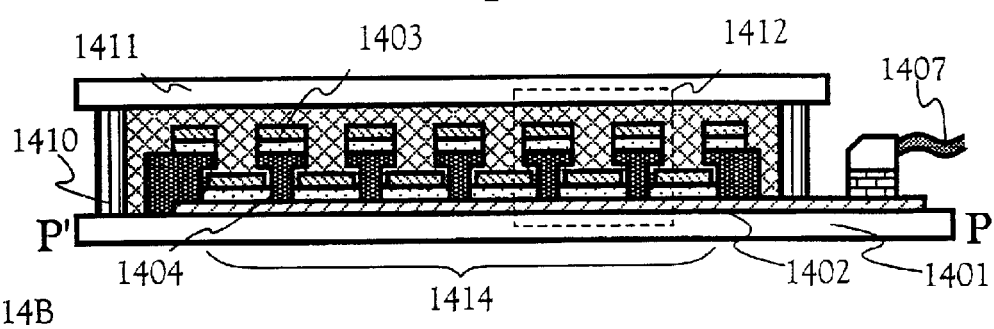

In this embodiment, as a example of the light emitting device including an organic EL element of the present invention, passive matrix type light emitting device will be described. FIG. 14A is a top view and FIG. 14B is a sectional view taken along P–P' of FIG. 14A.

In FIG. 14A, reference numeral 1401 designates a substrate, and here, a plastic material is used. As the plastic material, polyimide, polyamide, acryl resin, epoxy resin, PES (polyethylene sulfile), PC (polycarbonate), PET (polyethylene terephthalate), or PEN (polyethylene naphthalate) is shaped into a plate or a film and is used.

Reference numeral 1402 designates a scanning line (anode) made of an oxide conductive film, and in this embodiment, an oxide conductive film of zinc oxide, to which gallium oxide is added, is used. Reference numeral 1403 designates a data line (cathode) made of a metal film and a bismuth film is used in this embodiment. Reference numeral 1404 designates a bank made of acryl resin, and functions as a partition wall for dividing the data line 1403. A plurality of scanning lines 1402 and data lines 1403 are formed to have a stripe shape, and are provided to intersect with each other at right angles. Although not shown in FIG. 14A, a polymer EL layer is interposed between the scanning line 1402 and the data line 1403, and an intersection portion designated by 1405 becomes a pixel.

The scanning line 1402 and the data line 1403 are connected to an external driving circuit through a TAB tape 1407. Reference numeral 1408 designates a wiring group in which the scanning lines 1402 are collected, and 1409 designates a wiring group made of a collection of connection wiring lines 1406 connected to the data lines 1403. Although not shown, instead of the TAB tape 1407, a TCP in which an IC is provided on a TAB tape may be connected.

Besides, in FIG. 14B, reference numeral 1410 designates a seal member; and 1411, a cover member bonded to the plastic member 1401 by the seal member 1410. As the seal member 1410, a photo-curing resin may be used, and a material with little degassing and low moisture sorption is desirable. As the cover member, the same material as the substrate 1401 is desirable, and glass (including quartz glass) or plastic can be used. Here, a plastic member is used.

Figure 14C:
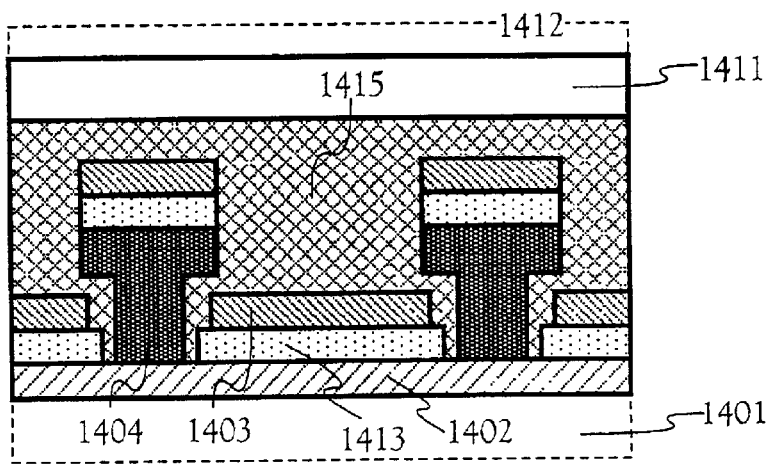

FIG. 14C is an enlarged view of a structure of a pixel 1412. Reference numeral 1413 designates a polymer EL layer. Incidentally, as shown in FIG. 14C, the bank 1404 has such a shape that the width of a lower layer is narrower than the width of an upper layer, and physically divides the data line 1403. A pixel portion 1414 surrounded by the seal member 1410 is cut off from the outer air by a sealing member 1415 made of resin and has a structure of preventing deterioration of the polymer EL layer.

Since the pixel portion 1414 is formed of the scanning lines 1402, the data lines 1403, the banks 1404, and the polymer EL layers 1413, the light emitting device of the present invention including the structure as described above can be fabricated by a very simple process.

Besides, a polarizing plate may be provided on a display surface (surface on which an image is observed) of the light emitting device shown in this embodiment. This polarizing plate suppresses reflection of light incident from the outside, and has an effect of preventing an observer from being reflected on the display surface. In general, a circular polarization plate is used. However, in order to prevent light emitted from the organic EL layer from being returned to the inside through reflection by the polarizing plate, it is desirable to make a structure have low inner reflection by adjusting refractivity.

Incidentally, for the organic EL element included in the light emitting device of this embodiment, any of the organic EL element of the present invention may be used.

[Embodiment 8]

In this embodiment, there is a description of an example in which a printed wiring board is provided with the light emitting device shown in the embodiment 7 to form a module.

Figure 15A:
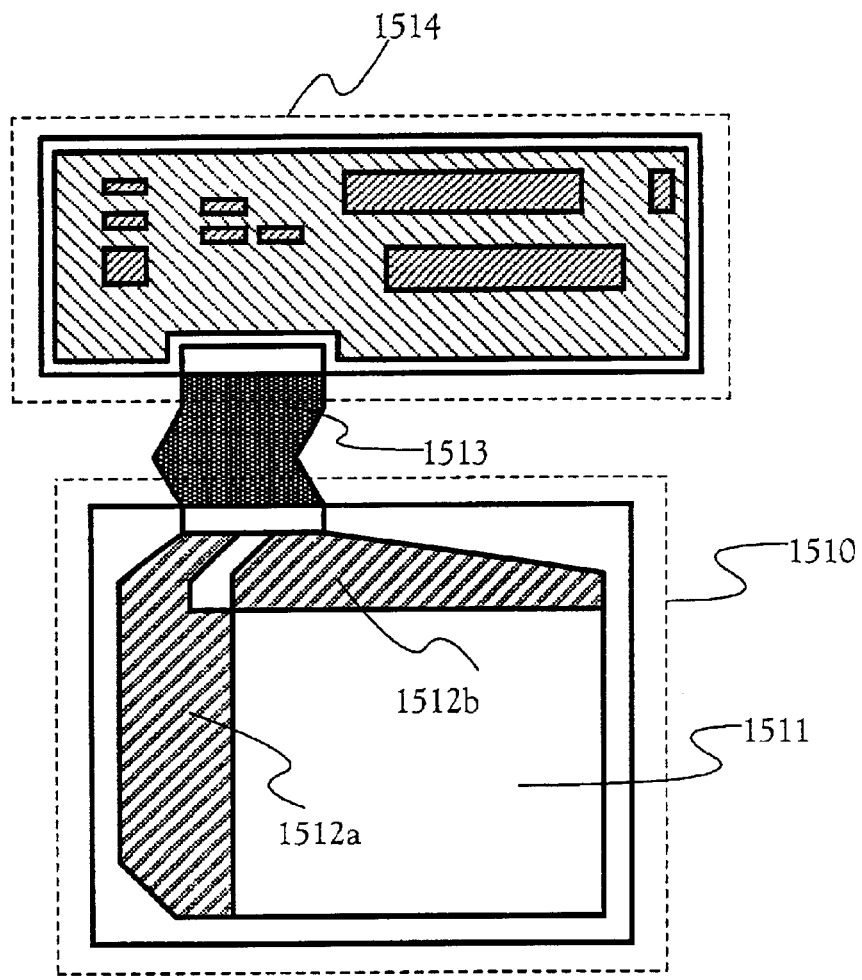
FIGS. 15A and 15B are diagrams illustrating a configuration of a light emitting device according to Embodiment 8.

In a module shown in FIG. 15A, a TAB tape 1513 is attached to a substrate 1510 (including a pixel portion 1511 and wiring lines 1512a and 1512b) over which an organic EL element is formed, and a printed wiring board 1514 is attached through the TAB tape 1513.

Figure 15B:
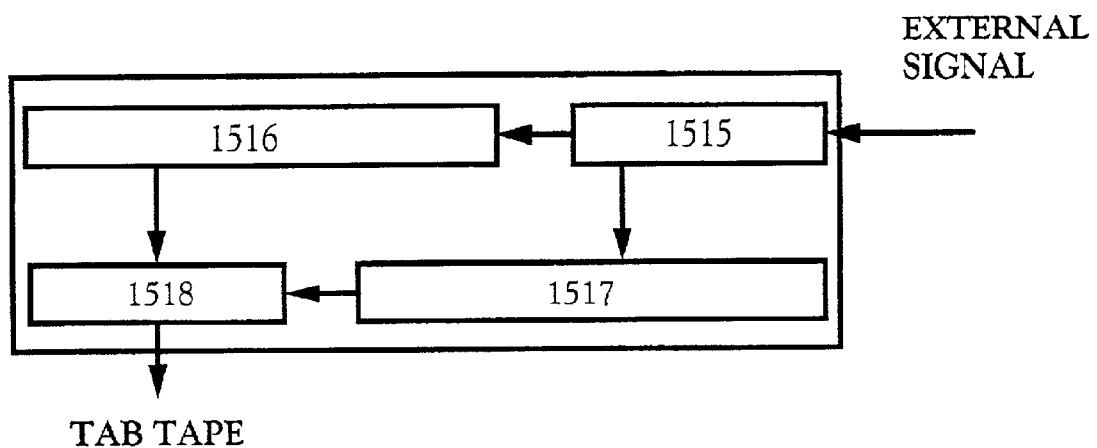

Here, FIG. 15B is a functional block diagram of the printed wiring board 1514. Inside the printed wiring board 1514, at least I/O ports (also called input or output portion) 1515 and 1518 and an IC functioning as a data signal side driving circuit 1516 and a gate signal side driving circuit 1517 are provided inside the printed wiring board 1514.

The module with the structure, in which the TAB tape is attached to the substrate which has the substrate surface on which the pixel portion is formed and the printed wiring board which has a function as a driving circuit is attached through the TAB tape, is especially called a module with an external driving circuit in the present specification.

Incidentally, as the organic EL element included in the light emitting device of this embodiment, any of the organic EL element of the present invention may be used.

[Embodiment 9]

In this embodiment, a description of an example in which a printed wiring board is provided with the light emitting device shown in the embodiment 6 or the embodiment 7 to form a module.

Figure 16A:
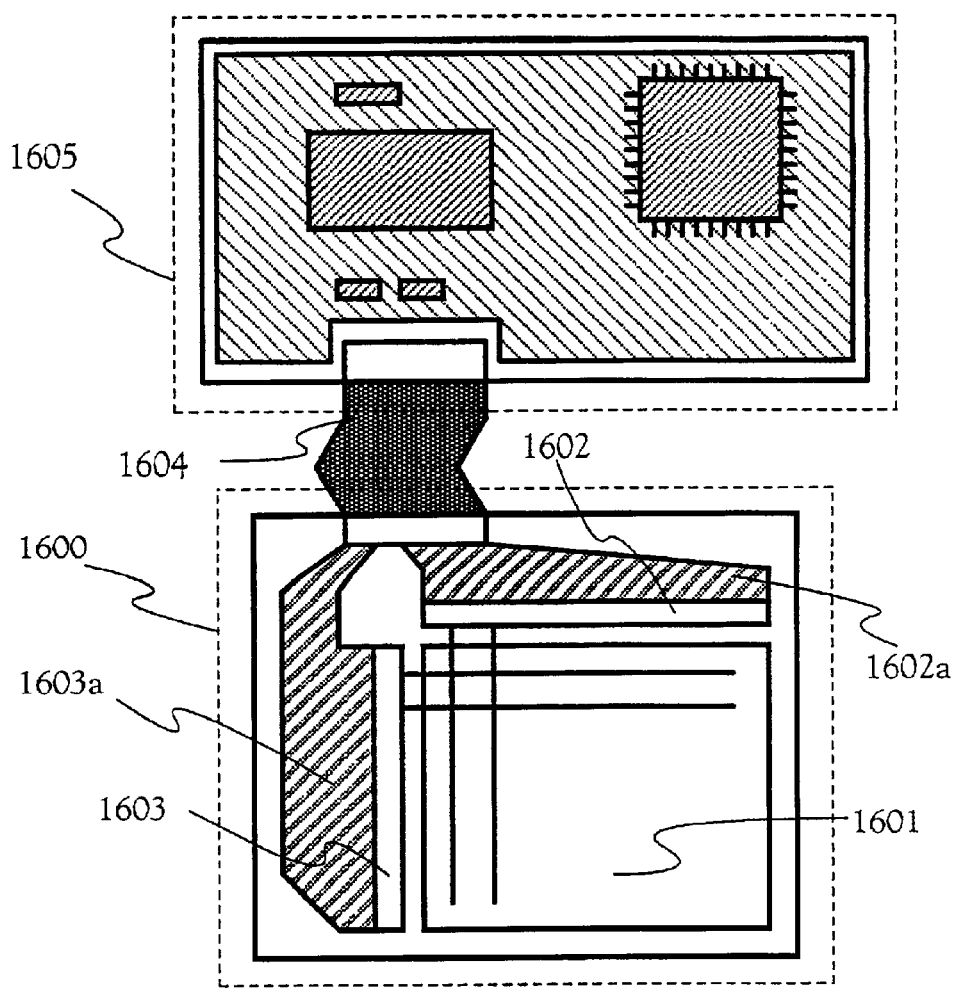
FIGS. 16A and 16B are diagrams showing a configuration of another light emitting device according to Embodiment 8.

In a module shown in FIG. 16A, a TAB tape 1604 is attached to a substrate 1600 (including a pixel portion 1601, a data signal side driving circuit 1602, a gate signal side driving circuit 1603, and wiring lines 1602a and 1603a) over which an organic EL element is formed, and a printed wiring plate 1605 is attached through the TAB tape 1604. Here, FIG. 16B is a functional block diagram of the printed wiring board 1605.

Figure 16B:
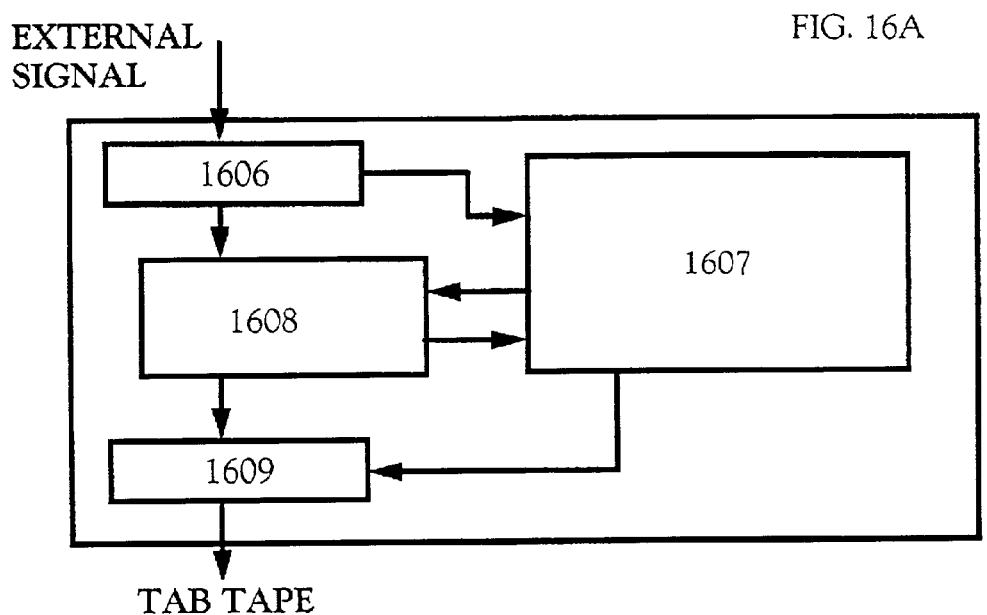

As shown in FIG. 16B, at least I/O ports 1606 and 1609, and an IC functioning as a control portion 1607 are provided inside the printed wiring board 1605. Incidentally, although a memory portion 1608 is provided here, it is not necessarily required. Besides, the control portion 1607 is a portion which has a function to control management of a driving circuit, correction of picture data, and the like.

The module of the structure, in which the printed wiring board with the function as a controller is attached to the substrate over which the organic EL element is formed, is especially called a module with an external controller in the present specification.

Incidentally, as the organic EL element included in the light emitting device of this embodiment, any of the organic EL element of the present invention may be used.

[Embodiment 10]

The light emitting display device of this invention has a superior visibility in a bright location in comparison with a liquid crystal display device since it is a self light emitting type, and also has a wide angle of view. Therefore, it can be used as a display portion of various electronic equipment.

Besides, the light emitting device of this invention is useful for a light source of various electronic devices because of which emits bright light and has low power consumption. Typically, it can be used as a light source for a back light or a front light of liquid crystal display and for an illumination equipment.

In this embodiment, an electronic device including the light emitting device for the display portion is disclosed. Its example is shown in FIG. 17A to 18B. Note that the organic EL element including of an electronic device of this embodiment may use any structure of FIGS. 1A to 6B. And the form of light emitting device including of the electronic device of this embodiment may use any form of FIG. 12 to 16B.

Figure 17A:
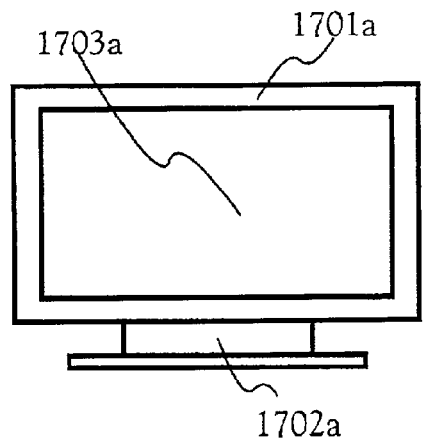
FIGS. 17A to 17F are diagrams showing specific examples of electric apparatuses Embodiment 10.

FIG. 17A is an organic EL display, and includes a frame 1701a, a support stand 1702a, and a display portion 1703a. The light emitting device of the present invention can be used in the display portion 1703a. The organic EL display is a self-light-emitting type, and therefore a back light is not necessary, and the display portion can be made thinner than that of a liquid crystal display device, and the display can be lightened.

Figure 17B:
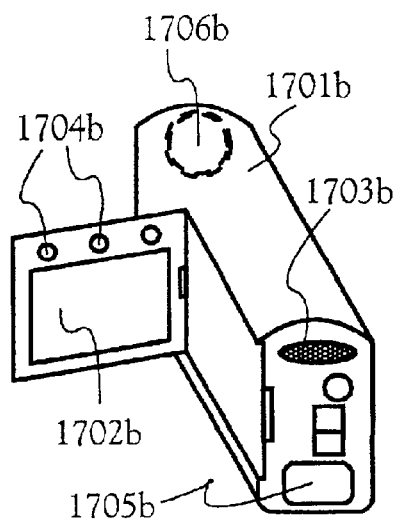

FIG. 17B is a video camera, and includes a main body 1701b, a display portion 1702b, a sound input portion 1703b, operation switches 1704b, a battery 1705b, and an image receiving portion 1706b. The light emitting device of the present invention can be used in the display portion 1702b.

Figure 17C:
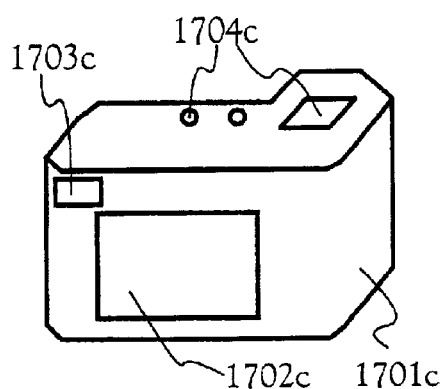

FIG. 17C is a digital camera and includes a main body 1701c, a display portion 1702c, an optical system 1703c, an operating switch 1704c. The light emitting device of the present invention can be used in the display portion 1702c.

Figure 17D:
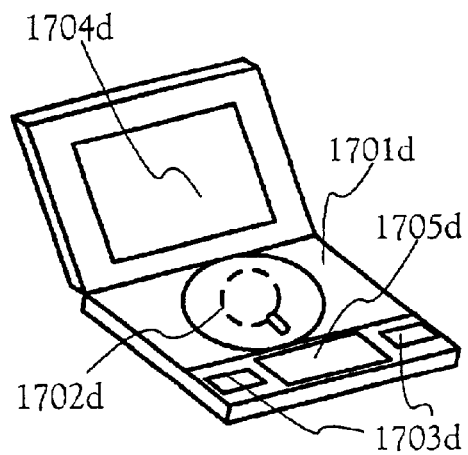

FIG. 17D is an image playback device equipped with a recording medium, and includes a main body 1701d, a recording medium (such as a CD, LD or DVD) 1702d, operation switches 1703d, a display portion (A) 1704d, and a display portion (B) 1705d. The display portion (A) 1704d is mainly used for displaying image information, and the display portion (B) 1705d is mainly used for displaying character information, and the light emitting device of the present invention can be used in the display portion (A) 1704d and for the display portion (B) 1705d. Note that, the image playback device equipped with the recording medium includes devices such as CD playback devices and game machines.

Figure 17E:
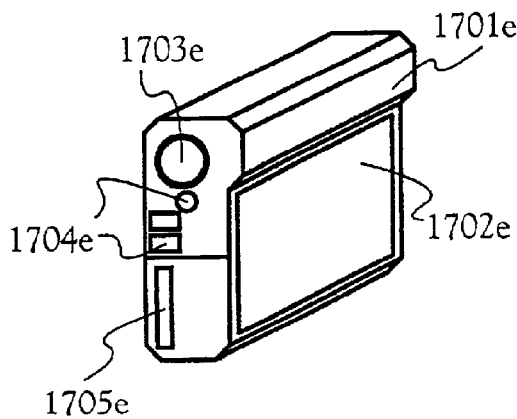

FIG. 17E is a portable (mobile) computer, and includes a main body 1701e, a display portion 1702e, an image receiving portion 1703e, operation switches 1704e, and a memory slot 1705e. The light emitting device of the present invention can be used in the display portion 1702e. This portable computer records information onto the recording medium accumulated with flash memory or non-volatile memory and can play back such recordings.

Figure 17F:
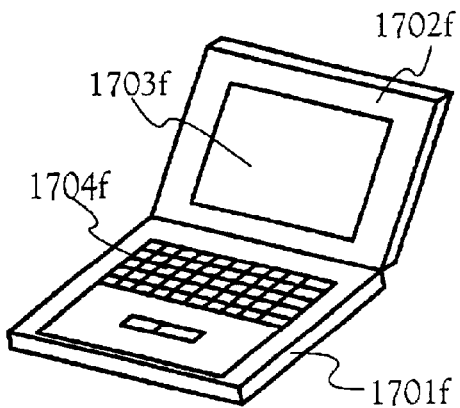

FIG. 17F is a personal computer, and includes a main body 1701f, a frame 1702f, a display portion 1703f, and a keyboard 1704f. The light emitting device of the present invention can be used in the display portion 1703f.

Note that, the above electronic appliances often display information distributed through an electronic communication network such as the Internet and radio communication such as a radio wave. In particular, there are more and more opportunities where the electronic appliances display dynamic image information. Since the response speed of an organic EL material is very high, a light emitting device is suitable for dynamic image display.

Figure 18A:
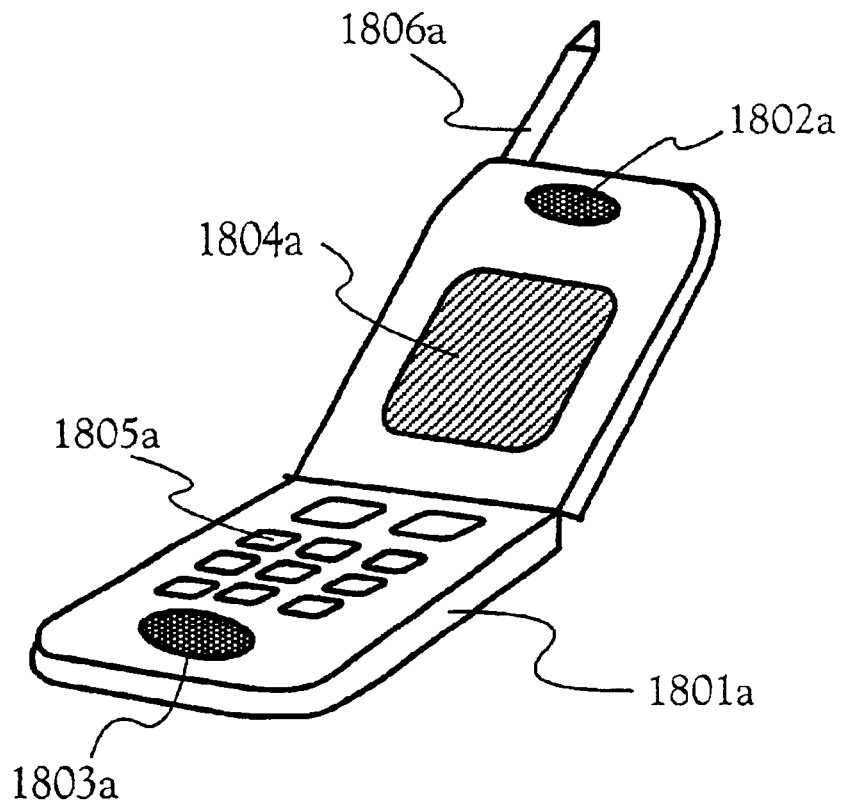
FIGS. 18A and 18B are diagrams showing specific examples of electric apparatuses Embodiment 10.

FIG. 18A is a cellular phone, and includes a main body 1801a, a sound output portion 1802a, a sound input portion 1803a, a display portion 1804a, operation switches 1805a, and an antenna 1806a. The light emitting device of the present invention can be used in the display portion 1804a.

Figure 18B:
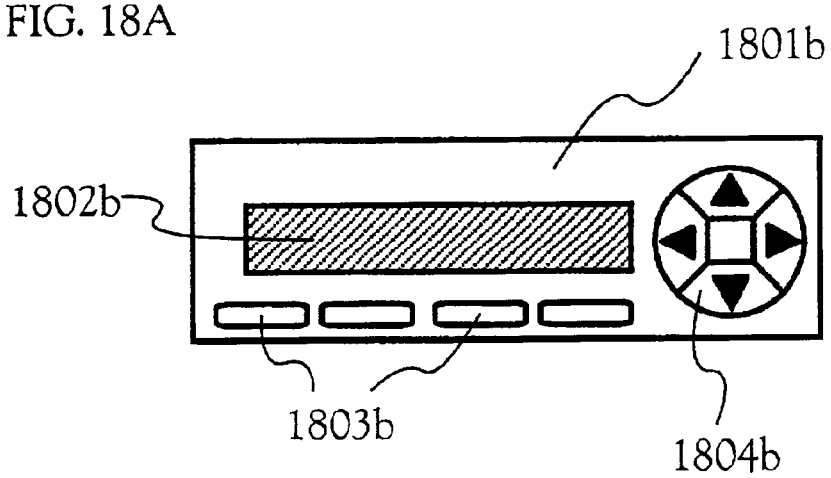

FIG. 18B is an audio playback device, (specifically a car audio system), and includes a main body 1801b, a display portion 1802b, and operation switches 1803b and 1804b. The light emitting device of the present invention can be used in the display portion 1802b. Further, a car audio system is shown in this embodiment, but the light emitting device of the present invention can be used in a household audio playback system, too.

Further, it is effective to incorporate the light sensor, to provide means to detect the brightness of the environment to be used, in order for it to function to modulate the luminous brightness according to the brightness of the environment to be used. If the user may maintain the brightness with a brightness of a contrast ratio of 100 to 150 compared to the brightness of the used environment, there is no problem in recognizing the image or the character information. That is, when the environment to be used is bright, the brightness of the image is increased so it is easy to see, and when the environment to be used is dark, the brightness of the image may be suppressed to thereby suppress the power consumption.

Note that in the case that the display portion of the electronic apparatuses shown in this embodiment in FIGS. 17A to 18B are the liquid crystal display. The light emitting device of the present invention can be used as a back light or a front light of the liquid crystal display.

The implementation of the present invention can provide a light emitting device that is bright, requires low power consumption, and is excellent in mechanical and heat-resistant properties. Moreover, by using such a light emitting device in a light source or a display portion, electric apparatuses can be obtained that are bright, require low power consumption, and have long lives.

What is claimed is:

1. A light emitting device comprising:
   at least an organic EL element;
   a thin film comprising a polymer material in the organic EL element;
   wherein the polymer material is expressed by

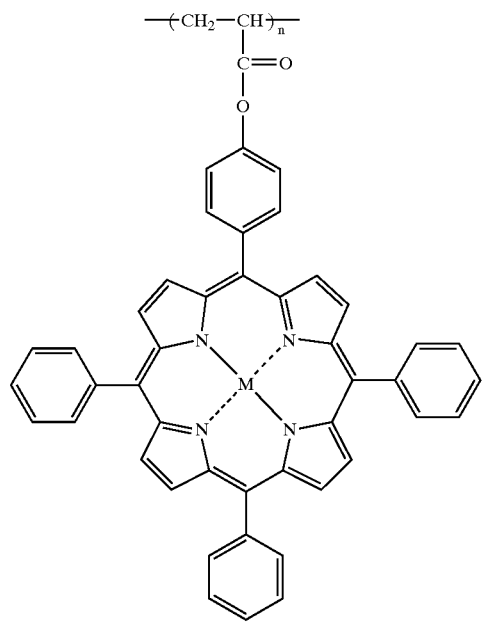

wherein M indicates a bivalent transition series element,
   wherein n denotes a polymerization degree (n=an integer of 2 of larger).

2. A light emitting device comprising:
   at least an organic EL element;
   a thin film comprising a polymer material in the organic EL element;,
   wherein the polymer material is expressed by

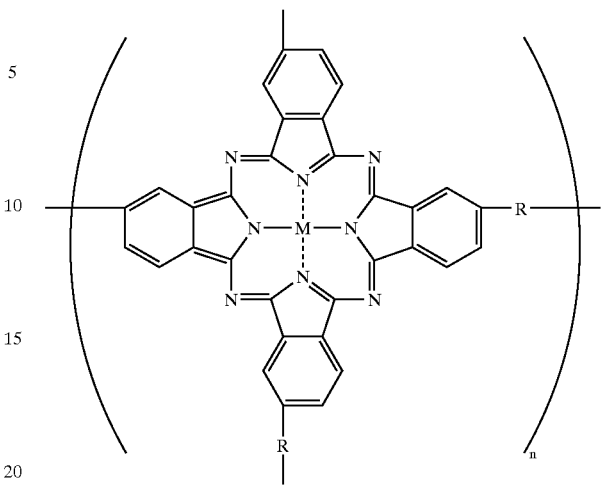

wherein R indicates one selected from the group consisting of a substituent containing a carbonyl group, a substituent containing a benzene ring, and an unsaturated-chain substituent containing olefin double bond,
   wherein M indicates a bivalent transition series element,
   wherein n denotes a polymerization degree (n=an integer of 2 or larger).

3. A light emitting device comprising:
   at least an organic EL element;
   a thin film comprising a hole transporting layer and a light emitting layer in the organic EL element;
   wherein the hole transporting layer comprises a polymer material,
   wherein the hole transporting layer contains molecules comprising bromine or iodine, or with a compound comprising transition metal.

4. A light emitting device comprising:
   at least an organic EL element;
   a thin film comprising a hole transporting layer, a electron transporting layer and a light emitting layer in the organic EL element;
   wherein the hole transporting layer contains molecules comprising bromine or iodine, or with a compound comprising transition metal,
   wherein the electron transporting layer contains one selected from the group consisting of alkali metal, alkaline earth metal and transition metal.

5. A light emitting device comprising:
   at least an organic EL element;
   a thin film comprising a hole transporting layer, an electron transporting layer, and a light emitting layer between the hole transporting layer and the electron transporting layer in the EL element;
   wherein the hole transporting layer comprises a polymer material, and
   wherein the hole transporting layer contains molecules comprising bromine or iodine, or with a compound comprising transition metal, or
   wherein the electron transporting layer contains one selected from the group consisting of alkali metal, alkaline earth metal and transition metal.

6. A light emitting device comprising:

at least an organic EL element;

a thin film comprising a hole transporting layer, an electron transporting layer in the organic EL element;

wherein the hole transporting layer contains molecules comprising bromine or iodine, or with a compound comprising transition metal, which is introduced by an ion implantation method, wherein the electron transporting layer comprising a polymer material, wherein the electron transporting layer contains one selected from the group consisting of alkali metal, alkaline earth metal and transition metal, which is introduced by an ion implantation method.

7. A light emitting device comprising:

at least an organic EL element;

a thin film comprising a hole transporting layer in the organic EL element;

wherein the hole transporting layer comprises a polymer material, wherein the hole transporting layer contains molecules comprising bromine or iodine, or with a compound comprising transition metal, which is introduced by an ion implantation method.

8. An electronic apparatus in combination with the light emitting device of claim 1.

9. An electronic apparatus in combination with the light emitting device of claim 2.

10. An electronic apparatus in combination with the light emitting device of claim 3.

11. An electronic apparatus in combination with the light emitting device of claim 4.

12. An electronic apparatus in combination with the light emitting device of claim 5.

13. An electronic apparatus in combination with the light emitting device of claim 6.

14. An electronic apparatus in combination with the light emitting device of claim 7.

15. An electronic apparatus according to claim 8, wherein the electronic apparatus is selected from the group consisting of a display, a video camera, a digital camera, an image playback device, a portable computer, a personal computer, a cellular phone and an audio playback device.

16. An electronic apparatus according to claim 9, wherein the electronic apparatus is selected from the group consisting of a display, a video camera, a digital camera, an image playback device, a portable computer, a personal computer, a cellular phone and an audio playback device.

17. An electronic apparatus according to claim 10, wherein the electronic apparatus is selected from the group consisting of a display, a video camera, a digital camera, an image playback device, a portable computer, a personal computer, a cellular phone and an audio playback device.

18. An electronic apparatus according to claim 11, wherein the electronic apparatus is selected from the group consisting of a display, a video camera, a digital camera, an image playback device, a portable computer, a personal computer, a cellular phone and an audio playback device.

19. An electronic apparatus according to claim 12, wherein the electronic apparatus is selected from the group consisting of a display, a video camera, a digital camera, an image playback device, a portable computer, a personal computer, a cellular phone and an audio playback device.

20. An electronic apparatus according to claim 13, wherein the electronic apparatus is selected from the group consisting of a display, a video camera, a digital camera, an image playback device, a portable computer, a personal computer, a cellular phone and an audio playback device.

21. An electronic apparatus according to claim 14, wherein the electronic apparatus is selected from the group consisting of a display, a video camera, a digital camera, an image playback device, a portable computer, a personal computer, a cellular phone and an audio playback device.

* * * * *